United States Patent [19]
Maeno et al.

[11] Patent Number: 5,714,407
[45] Date of Patent: Feb. 3, 1998

[54] ETCHING AGENT, ELECTRONIC DEVICE AND METHOD OF MANUFACTURING THE DEVICE

[75] Inventors: Matagoro Maeno, Izumi; Masayuki Miyashita, Sakai; Hirohisa Kikuyama, Nara; Tatsuhiro Yabune, Sendai; Jun Takano, Sakai; Hirofumi Fukui, Miyagi-ken; Satoshi Miyazawa, Sendai; Chisato Iwasaki, Miyagi-ken; Tadahiro Ohmi, 1-7 Yukigaya, Otsuka-cho, Ota-ku, Tokyo; Yasuhiko Kasama; Hitoshi Seki, both of Sendai, all of Japan

[73] Assignees: Frontec Incorporated, Tokyo; Tadahiro Ohmi, Sendai, both of Japan

[21] Appl. No.: 414,973

[22] Filed: Mar. 31, 1995

[30] Foreign Application Priority Data

Mar. 31, 1994 [JP] Japan ................... 6-063789
Jul. 1, 1994 [JP] Japan ................... 6-151376

[51] Int. Cl.$^6$ .................. H01L 21/00; C09K 13/00
[52] U.S. Cl. ......................... 439/228; 252/79.2
[58] Field of Search ............... 252/79.2; 437/228; 156/644.1, 655.1, 656.1, 657.1

[56] References Cited

U.S. PATENT DOCUMENTS

| | | | |
|---|---|---|---|
| 4,578,419 | 3/1986 | Hall | 524/401 |
| 5,300,463 | 4/1994 | Cathey et al. | 437/228 |
| 5,409,569 | 4/1995 | Seki et al. | 252/79.2 X |

OTHER PUBLICATIONS

"Chemical Etching for the Evaluation of Hydrogenated Amorphous Silicon Films" by T.L. Chu and Shirley S. Chu (Appl. Phys. Lett. 48 (26), 30 Jun. 1986.

*Primary Examiner*—Thi Dang
*Attorney, Agent, or Firm*—Guy W. Shoup

[57] ABSTRACT

An etching agent and an electronic device manufacturing method using the etching agent. The etching agent contains, in a solution, hydrofluoric acid at a concentration of 0.05 to 0.5 mol/l, and halooxoacid ions, represented by the formula $(XO_n)^{p-}$ (wherein X is a halogen element, n is 3, 4 or 6, p is 1, 2 or 3), at a concentration of at least 0.01 mol/l. An electronic device manufactured using the etching agent requires only a single etching step to etch both conductive layers (such as aluminum) as well as ohmic contact layers (a-Si).

18 Claims, 16 Drawing Sheets

| ETCHING AGENT | IMMERSION TIME | | |
|---|---|---|---|
| | 72" | 78" | 84" |
| HF= 0.5mol/ℓ HIO$_3$= 0.056 mol/ℓ ETCHING RATE (nm/min) Aℓ=250 Si=250 | Aℓ / RESIST / N$^+$-TYPE a-Si / a-Si | | |

| ETCHING AGENT | IMMERSION TIME | | |
|---|---|---|---|
| | 3' | 3.5' | 4' |
| HF= 0.1mol/ℓ HIO$_3$= 0.056 mol/ℓ ETCHING RATE (nm/min) Aℓ=100 Si=50 | Aℓ / RESIST / N$^+$-TYPE a-Si / a-Si | | |

Aℓ, N$^+$-TYPE a-Si, a-Si

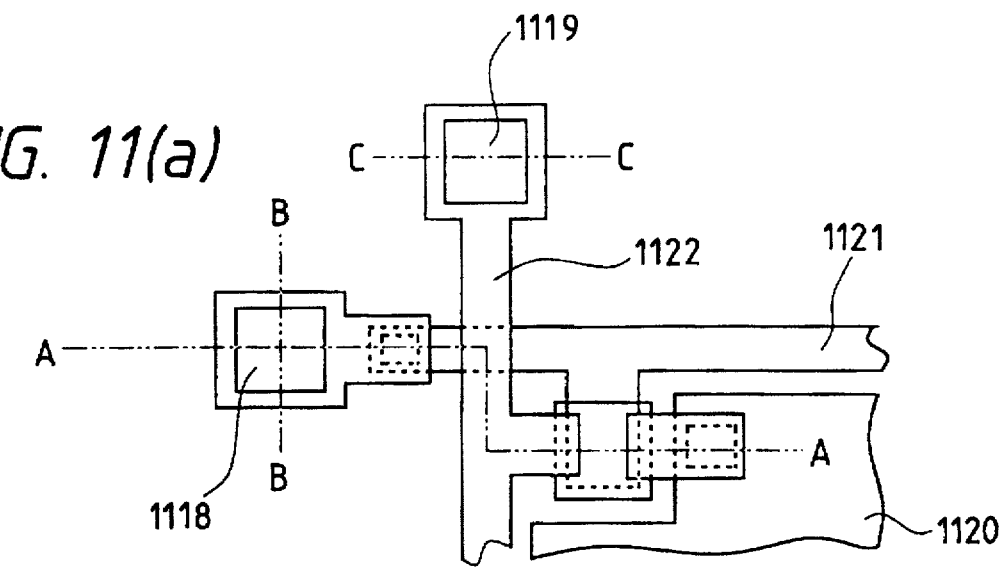
FIG. 11(a)
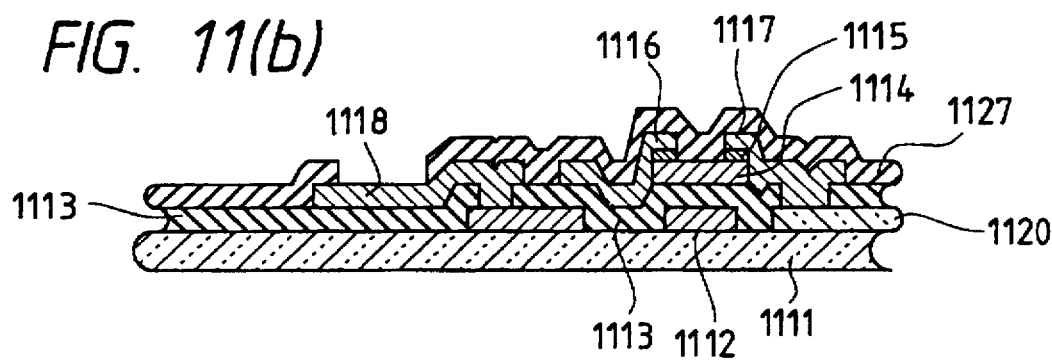
FIG. 11(b)
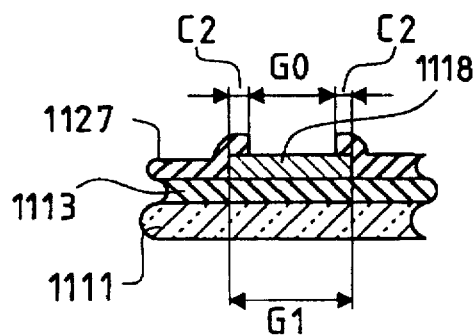 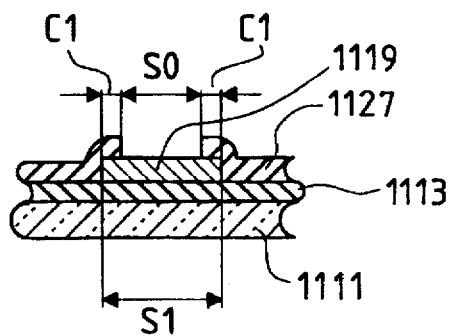
FIG. 11(c)    FIG. 11(d)

ETCHING AGENT, ELECTRONIC DEVICE AND METHOD OF MANUFACTURING THE DEVICE

BACKGROUND OF THE INVENTION

1. Field of the Invention

The present invention relates to an etching agent, an electronic device and a method of manufacturing an electronic device. More particularly, the present invention relates to an etching agent, and a method of manufacturing an electronic device using the etching agent, which permits batch etching of a multi-layer film comprising a conductor layer and a semiconductor layer using the same etching agent. The present invention further relates to an electronic device and a method of manufacturing the device in which the shapes of openings etched in a conductor layer and an ohmic contact layer are controlled so as to improve the characteristics and reliability of the electronic device.

2. Description of the Related Art

Conventional etching processes used in the production of semiconductor materials such as silicon typically employs a mixed solution of hydrofluoric acid, nitric acid and acetic acid. However, because this etching solution violently generates heat and nitrogen oxide gas, and causes degradation or separation of resist due to the nitric acid during the etching process, the formation of a precise (fine) pattern is considered difficult.

In order to solve the above problem, the inventors of the present invention developed an etching agent containing hydrofluoric acid and an oxoacid or an oxoacid salt compound (Japanese Patent Application No. 4-285338).

On the other hand, for example, in the production of an electronic device used for driving a liquid crystal display, a manufacturing method resulting in higher pattern precision and device productivity (yield) is demanded with increases in the display size and pixel density. The method of manufacturing an electronic device is described below with reference to the reverse stagger structure thin film transistor (TFT) shown in FIG. 16, as an example.

A conventional TFT is manufactured, for example, by the following method. A Cr film is first formed on a glass substrate 1600 by sputtering, and gate electrodes 1601 and gate wiring 1602 are then formed by patterning. A gate insulating film 1603 (e.g., SiNx), an i-type (un-doped) amorphous silicon (a-Si) layer 1604 and an n$^+$-type (doped) a-Si layer 1605 are then deposited by a plasma CVD process, or a similar process.

The n$^+$-type a-Si layer and i-type a-Si layer are etched using a HF-HNO$_3$ mixture to separate respective devices, and a conductor layer Al (containing 1 to 2% Si) is then formed by sputtering.

A source-drain electrode, wiring 1606, and a channel portion 1607 are then formed by etching the conductor layer Al with a phosphoric acid etching solution, and n$^+$-type a-Si is etched with a mixture of HF and HNO$_3$.

Finally, a passivation film is deposited using the plasma CVD process, and openings are formed for the gate wiring and source-drain wiring to complete the manufacture of the thin film transistor.

When a TFT is formed by the above method, separate steps of etching the conductor layer 1606 and etching the ohmic contact semiconductor layer 1605 are required. In the conventional method, after a resist pattern is formed, the conductor layer 1606 is etched with a first etching solution specifically formulated for a metal layer, and the ohmic contact layer 1605 is then etched with a second etching solution comprising HF and HNO$_3$ which is specifically formulated for the ohmic contact layer.

Since the conventional method uses two types of etching solutions, and washing is required between the respective etching steps, the etching process is very time consuming and thus reduces productivity. In addition, the repetition of the etching and washing steps deteriorates the adhesion of the resist deposited on the device during production, thereby easily producing defects in the resultant pattern. Moreover, when an etching barrier layer is provided between the conductor layer and the ohmic contact layer of a TFT, the use of multiple etching solutions and multiple etching a washing steps becomes an additional problem.

Further, the etching of aluminum (Al), which is a material typically used to form conductor layers, creates an additional problem because the typical Al etching solution has a high viscosity because etching remainder (un-etched Al) causes short-circuit defects, particularly in fine pattern portions of a resulting electronic device.

The conventional method shown in FIG. 16 also causes side etching of the ohmic contact layer, and thus forms a gap 1701 due to etching of the ohmic contact layer below the exposed edge of the conductor layer, as shown in FIG. 17(a).

The TFT frequently comprises a conductor layer formed on top of a barrier layer (for example, tungsten (W)) whose purpose is to prevent the diffusion of Al. When a barrier layer is used, a gap 1702 is typically produced between the W layer and an exposed edge of the n$^+$-type a-Si ohmic contact layer, as shown in FIG. 17(b).

Although it is commonly known that the gaps 1701 and 1702 are produced during etching of a multi-layer film, substantially no attention has been paid to the effect of these gaps on the characteristics of a device. However, during the development of an electronic device having high density and excellent characteristics, the inventors of the present invention found that the degree of precision produced by the conventional manufacturing method is limited, and that the cause of this limit is related to the above-mentioned gaps. Namely, there are definite relationship between the gaps and the characteristics of a TFT device, variations in the characteristics between various TFT devices, and the reliability of the TFT devices. That is, the formation of a small gap deteriorates the characteristics of a device, increases variation in characteristics and deteriorates the reliability of the device.

SUMMARY OF THE INVENTION

An object of the present invention is to provide an etching agent which enables the continuous formation of a fine pattern in a multi-layer structure including a conductor layer, a semiconductor layer, etc. by using a single etching solution.

Another object of the present invention is to provide an electronic device having excellent characteristics, fewer performance variations and excellent reliability.

A further object of the present invention is to provide an electronic device manufacturing method in which electronic devices can be generated using a short manufacturing process which produces a high yield.

In accordance with a first aspect of the present invention, an etching agent contains, in a solution, 0.05 to 0.5 mol/l of hydrofluoric acid and at least 0.01 mol/l of halooxoacid ions represented by the formula (XO$_n$)$^{p-}$ wherein X is a halogen element, n is 3, 4 or 6, and p is 1, 2 or 3.

In accordance with a second aspect of the present invention, an etching agent contains, in a solution, hydrofluoric acid, halooxoacid ions represented by the formula $XO_n^{p-}$ wherein X is a halogen element, n is 3, 4 or 6, and p is 1, 2 or 3, and a halogen precipitation inhibitor.

In accordance with a third aspect of the present invention, an electronic device comprises a multi-layer film having a semiconductor layer, an ohmic contact layer and a conductor layer, wherein openings are respectively formed in portions of the ohmic contact layer and the conductor layer, and a passivation film is formed within a predetermined region including the openings, a width of an opening formed in the conductive layer being larger than a width of an adjoining opening formed in the ohmic contact layer.

In accordance with a fourth aspect of the present invention, an electronic device manufacturing method comprises successively laminating a semiconductor layer, an ohmic contact layer and a conductor layer to form a multi-layer film, forming openings by continuously removing portions of the conductor layer and the ohmic contact layer using an etching solution which etches both the conductor layer and the ohmic contact layer during a single etching step, wherein the etching solution etches the conductor layer at a higher etching rate than the ohmic contact layer, and then forming a passivation film in a predetermined region including the openings.

In accordance with a fifth aspect of the present invention, an electronic device manufacturing method comprises continuously etching an ohmic contact layer and a conductor layer, which are laminated on the surface of a semiconductor layer, using an etching agent containing, in a solution, 0.05 to 0.5 mol/l of hydrofluoric acid and at least 0.01 mol/l of halooxoacid ion represented by the formula ($XO_n^{p-}$ wherein X is a halogen element, n is 3, 4 or 6, and p is 1, 2 or 3.

During experimentation to determine new manufacturing processes for increasing the efficiency and yield of electronic devices, and for shortening the manufacturing process, the inventors found that an etching solution containing hydrofluoric acid and halooxoacid ions at appropriate concentrations is capable of etching semiconductors, various metals, alloys and metallic compounds such as silicides and the like to form a fine pattern.

The inventors believe one possible mechanism of the etching process is that the halooxoacid ions, serving as a strong oxidizing agent, oxidize a solid surface of a semiconductor, a metal or the like, and then the hydrofluoric acid dissolves the thus-produced oxide. For a metal such as aluminum (Al) or the like which reacts with hydrofluoric acid, therefore, when the above-mentioned etching solution is used, oxidation with halooxoacid ions preferentially proceeds, and the generation of gas due to direct reaction between a metal and hydrofluoric acid is thus inhibited, thereby permitting stable etching.

In other words, the use of the etching agent of the present invention prevents the violent generation of heat and gases in reaction with a semiconductor, a metal or a metallic compound, and thus enables the formation of a fine pattern in a semiconductor, metal or the like. Also, because resist reacts very stably to the etching agent, side etching of the resist, which can result in a deterioration in the adhesion of the resist or separation thereof, is inhibited, thereby permitting the formation of a fine pattern. Further, since the etching agent of the present invention is chemically stable, the etching agent is capable of stable etching for a long period of time and therefore provides a cost advantage, as compared with conventional etching agents.

It is thus possible to stably form a fine pattern in a multi-layer laminated structure comprising a metal layer, a metallic compound layer and a semiconductor layer by using the same etching agent. The metal layer and semiconductor layer may have a multi-layer structure comprising at least two layers, so long as the etching agent of the present invention can be applied.

The etching agent of the present invention preferably contains 0.05 to 0.5 mol/l of hydrofluoric acid and 0.01 mol/l of halooxoacid ions. If the concentration of hydrofluoric acid exceeds 0.5 mol/l, variations in the etching process occur easily due to the direct reaction between a metal and hydrofluoric acid. Because these variations affect the semiconductor layer which serves as a ground layer, and adversely affect the characteristics of a device, the concentration of hydrofluoric acid is preferably less than 0.5 mol/l. This is because, while etching an amorphous thin film transistor having an ohmic contact layer which is several tens of nm thick and a conductor layer which is several hundred nm thick, both of which being formed on an i-type Si layer, if the concentration of hydrofluoric acid over 0.5 mol/l, then the etching rate is significantly decreased in the direction of depth, thereby causing difficulties in reliably obtaining a desired end point.

The concentration range of hydrofluoric acid depends upon the concentration of oxoacid ions, but it is more preferably 0.33 mol/l or less. Within this range, the generation of bubbles due to the direct reaction between hydrofluoric acid and a metal is further inhibited, and more uniform etching thus becomes possible. On the other hand, a concentration lower than 0.05 mol/l significantly decreases the etching rates of the semiconductor layer and the conductor layer, and is this undesirable for practical use.

The etching agent of the present invention preferably contains halooxoacid ions at a concentration of 0.01 mol/l or more, more preferably 0.02 mol/l or more, and most preferably 0.04 mol/l or more. This is because, at a concentration lower than 0.01 mol/l, although reasons are not well understood, abnormal etching easily occurs in which a portion around the etched portion of the semiconductor layer is extremely etched. Within the region of low concentrations of halooxoacid ions, the ratio of the direct reaction between a metal such as Al or the like and hydrofluoric acid to the reaction including oxidation of Al with halooxoacid ions and dissolution of the produced oxide with hydrofluoric acid is increased, as described above. It is thus preferable for uniform etching that the concentration of halooxoacid ions is 0.02 mol/l or more, and more preferably 0.04 mol/l or more.

At a high concentration of halooxoacid ions, the etching rate is decreased, and halogen material such as iodine (I) or the like is precipitated due to the etching reaction. Therefore, the upper limit of the concentration of halooxoacid ions is appropriately determined in accordance with a design of an etched device (the thicknesses of the semiconductor layer and the conductor layer, etc.) or in consideration of a balance with iodine ions for preventing precipitation of halogen material or the concentration of an organic solvent.

The halooxoacid ions used in the present invention can be obtained by dissolving halooxoacid or halooxoacid salt in water. Examples of halooxoacids or halooxoacid salt compounds include bromic acid ($HBrO_3$), potassium bromate ($KBrO_3$), sodium bromate ($NaBrO_3$), ammonium bromate ($NH_4BrO_3$), calcium bromate ($Ca(BrO_3)_2$), magnesium bromate ($Mg(Bro_3)_2$), aluminum bromate ($Al(BrO_3)_3$), perbromic acid ($HBrO_4$), lithium perbromate ($LiBrO_4$), potassium perbromate (KBrO$_4$), iodic acid (HIO$_3$), potassium iodate (KIO$_3$), sodium iodate (NaIO$_3$), ammonium iodate (NH$_4$IO$_3$), calcium iodate (Ca(IO$_3$)$_2$), magnesium iodate (Mg(IO$_3$)$_2$), aluminum iodate (Al(IO$_3$)$_3$), periodic acid (HIO$_4$), lithium periodate (LiIO$_4$), potassium periodate (KIO$_4$) and the like. Of these compounds, iodic acid (HIO$_3$), potassium iodate (KIO$_3$) and potassium bromate (KBrO$_3$) are easiest to handle and are thus preferable. Because iodic acid (HIO$_3$) does not contain a metal element which could possibly act as a contamination source for a semiconductor material, it is believed to be optimal for use in an etching agent for a semiconductor device which is a representative electronic device.

The etching agent of the present invention preferably contains iodine ions. The addition of iodine ions changes iodine (I$_2$) generated by etching into I$_3^-$ which dissolves the agent, thereby preventing the precipitation of halogen. NH$_4$I, KI, NaI or the like is preferably used as an iodine ion source. It is thus possible to prevent etching defects in the precipitation portion and perform a uniform and stable etching process.

The etching agent of the present invention also preferably contains a water-soluble organic solvent such as alcohol, carboxylic acid or the like. Examples of alcohols include methanol, ethanol, isopropyl alcohol, propanol, butanol, ethylene glycol, propanediol, butanediol, glycerin and the like. Examples of organic acids include acetic acid, propionic acid and the like. The addition of the organic solvent permits more uniform and stable etching due to the dissolution of the produced halogen such as iodine, and can inhibit variations of the etching depth in a substrate. In the present invention, acetic acid, methanol or ethanol is preferable. However, if the concentration of the organic solvent exceeds by 70% by volume, since the resist is corroded with the organic solvent, the concentration is preferably 70% by volume or less.

Even if the etching agent of the present invention has a composition other than the above preferable composition (0.05 to 0.5 mol/l hydrofluoric acid, 0.01 mol/l or more halooxoacid ions), the addition of a halogen precipitation inhibitor can prevent an etching defect in the precipitation portion caused by halogen precipitation, and further improve the uniformity of etching.

Iodine ion or a water-soluble organic solvent is preferably used as the halogen precipitation inhibitor. Particularly, NH$_4$I, KI, NaI or the like is preferably used as an iodine ion source. As a water-soluble organic solvent, an alcohol such as methanol, ethanol, isopropyl alcohol, propanol, butanol, ethylene glycol, propanediol, butanediol, glycerin or the like, a carboxylic acid such as acetic acid, propionic acid or the like is preferably used. Of these organic solvents, acetic acid, methanol or ethanol are preferred.

As described above, the present invention has been achieved based on the findings of the inventors that, during the etching process, the gap formed between the semiconductor layer and the ohmic contact layer significantly affects the characteristics of an electronic device, variations in the characteristics and the reliability of the device.

A deterioration in the characteristics and reliability of an electronic device caused by the gap between the conductor layer and the ohmic contact layer are possibly caused by the following phenomenon: If such a gap is formed, a passivation film typically cannot be formed in the gap, and even if the passivation film is formed in the gap, only a rough film with low denseness is formed, and thus the device is liable to deteriorate.

Measurement using an energy dispersive X-ray microanalyzer indicated that the passivation film formed in the gap contained large amounts of impurities such as oxygen, etc. This is possibly due to the position and thinness of the gap, thereby preventing complete removal of the etching solution located in the gap by a cleaning fluid, or preventing the cleaning fluid and etching solution from being completely removed from the gap during a subsequent drying process.

The impurities contaminate the channel portion when the passivation film is deposited, and thus deteriorate the device characteristics such as carrier mobility, etc. These impurities can also diffuse into the channel portion over time, after the passivation film is deposited, and thus deteriorate the characteristics of the device.

On the other hand, in the electronic device of the present invention, the ohmic contact layer and the conductor layer are continuously etched in a batch manner using an etching solution which causes a higher etching rate of the conductor layer than that of the ohmic contact layer. It is thus possible to make the width of the opening in the conductor layer greater than that of the ohmic contact layer, and thereby to prevent the formation of a gap between both layers. As a result, the entire opening surface can be covered with a dense passivation film, thereby obtaining an electronic device having high reliability. It is also possible to prevent the etching solution or the cleaning fluid from becoming trapped in the gap, and thus inhibits contamination from residual liquids. The resultant electronic device exhibits excellent characteristics such as carrier mobility, etc., and does not exhibit variations thereof, and thus the yield of electronic devices is significantly improved.

It is preferable to inhibit the formation of these gaps by using an etching solution containing at least 0.05 to 0.33 mol/l of hydrofluoric acid and 0.1 mol/l or more of halooxoacid ions. The concentration of hydrofluoric acid is more preferably 0.05 to 0.2 mol/l. Within this composition range, the etching rate of the conductor layer is greater than that of the ohmic contact layer, and control over the etching process is improved, thereby providing a reliably reproducible etching process. This also allows for finer (more precise) etching which can be stably performed.

The concentration of halooxoacid ions is more preferably at least 0.02 mol/l, most preferably at least 0.04 mol/l. This is because, at a concentration of halooxoacid ions lower than 0.01 mol/l, as described above, abnormal etching easily occurs in which a portion of the semiconductor layer below the opening can be excessively etched. Within the range of low concentrations of halooxoacid ions, as described above, the ratio of the direct reaction between a metal, such as Al, and hydrofluoric acid to the reaction including oxidation of Al and dissolution of the produced oxide with hydrofluoric acid is increased. Therefore, it is preferable that the concentration of halooxoacid ions is at least 0.02 mol/l, more preferably 0.04 mol/l, to produce uniform etching.

The use of an etching solution having the above composition facilitates batch formation of a multi-layer laminated structure comprising a metal layer, an ohmic contact layer and a semiconductor layer, because the same etching solution is used for etching both the metal layer and the ohmic contact layer, and can completely prevent the generation of a gap between the conductor layer and the ohmic contact layer. It is thus possible to stably manufacture an electronic device exhibiting excellent characteristics and high reliability. The addition of iodine ions and/or a water-soluble organic solvent to the etching solution prevents etching defects caused by halogen precipitation, and further improves the uniformity of etching process.

Examples of materials used for the conductor layer to which the prevent invention can be usefully applied include Al, Mo, Ni, Ta, Pt, Ti, Pd, W, Co, Cr and the like, alloys thereof, and metallic compounds (silicide, etc.) comprising these metals and semiconductors. The conductor layer can include a multi-layer structure comprising at least two layers of a metal, an alloy or a metallic compound.

Examples of semiconductors which can be used in the present invention include Si, Ge, GaAs, GaSb, InAs, InSb and the like. The semiconductor in any one of amorphous, polycrystal and single crystal forms can be used.

In the description of the present invention, the statement that the width of the opening of the conductor layer is greater than that of the ohmic contact layer is intended to mean that a minimum width of the opening of the conductor layer (which is wider at an upper surface than along a depthwise direction thereof) is greater than the maximum width of the opening of the ohmic contact layer (which similarly changes in the depthwise direction thereof).

BRIEF DESCRIPTION OF THE DRAWINGS

FIG. 11(a) and 11(b) through 11(d) are plan and sectional views, respectively, showing a portion of a TFT substrate according to a fifth embodiment of the present invention;

DESCRIPTION OF THE PREFERRED EMBODIMENTS

The present invention will be described in detail with respect to the following embodiments. It is understood that the present invention is not limited by these embodiments.

(Embodiment 1)

According to the first embodiment of the present invention, Al or i-type amorphous silicon (a-Si) was deposited on a glass substrate by a sputtering or plasma CVD process, and the relations between the etching solution composition and the etching rate and the surface conditions were examined. The results obtained are shown in FIGS. 1 to 4 and Table 1.

Figure 1A:
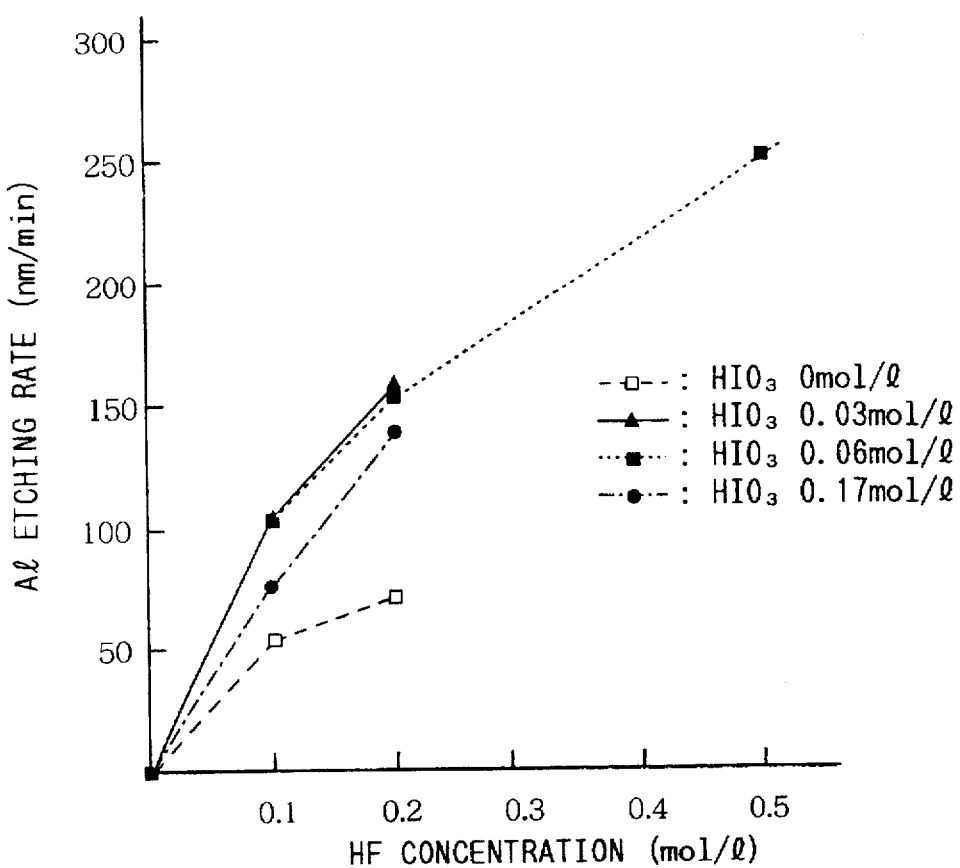
FIGS. 1(a) and 1(b) are graphs showing the relations between the etching rates of Al and Si and the etching agent composition according to a first embodiment of the present invention.
Figure 1B:
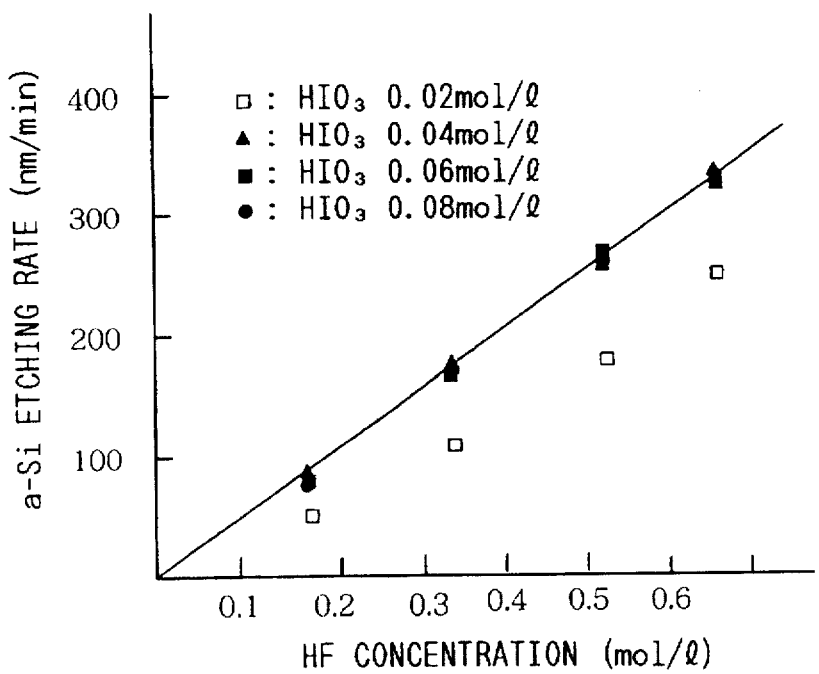

FIGS. 1(a) and 1(b) are graphs showing the relations between the etching rates of Al and i-type a-Si and the HF and $HIO_3$ concentrations of an etching solution. As shown in FIG. 1(a), the etching rate of Al tends to increase with increases in the HF concentration, and first increase and then decrease with increases in $HIO_3$ concentration. FIG. 1(b) shows that the etching rate of Si increases with increases in the HF concentration and $HIO_3$ concentration, but is saturated at a $HIO_3$ concentration of 0.04 mol/l.

Figure 2A:
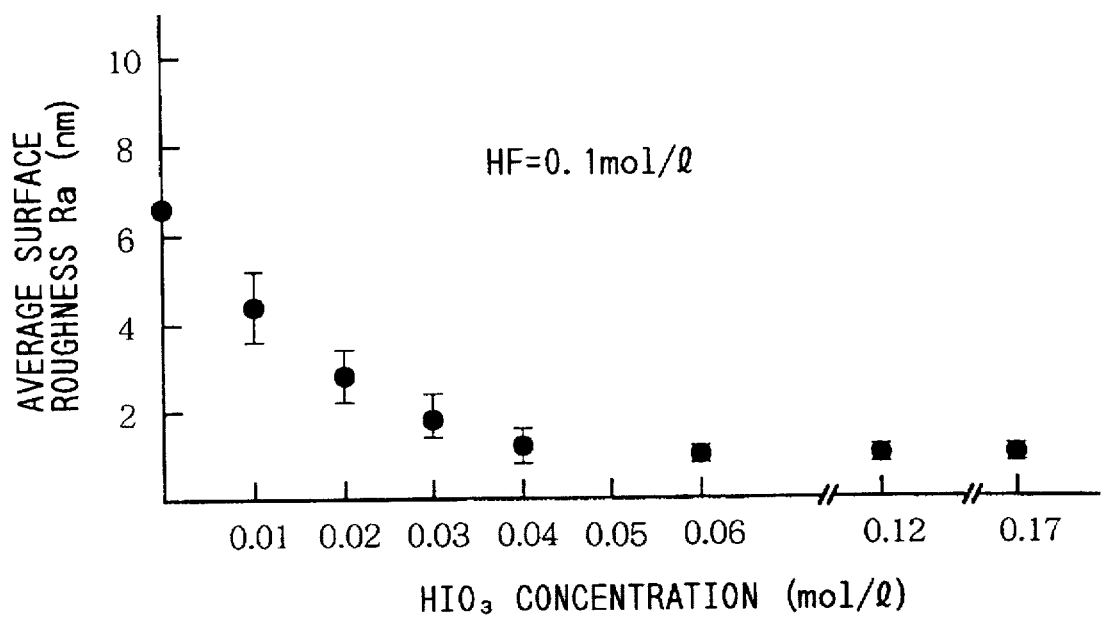
FIGS. 2(a) and 2(b) are graphs showing the relation between the average surface roughness Ra of Al and the etching agent composition.
Figure 2B:
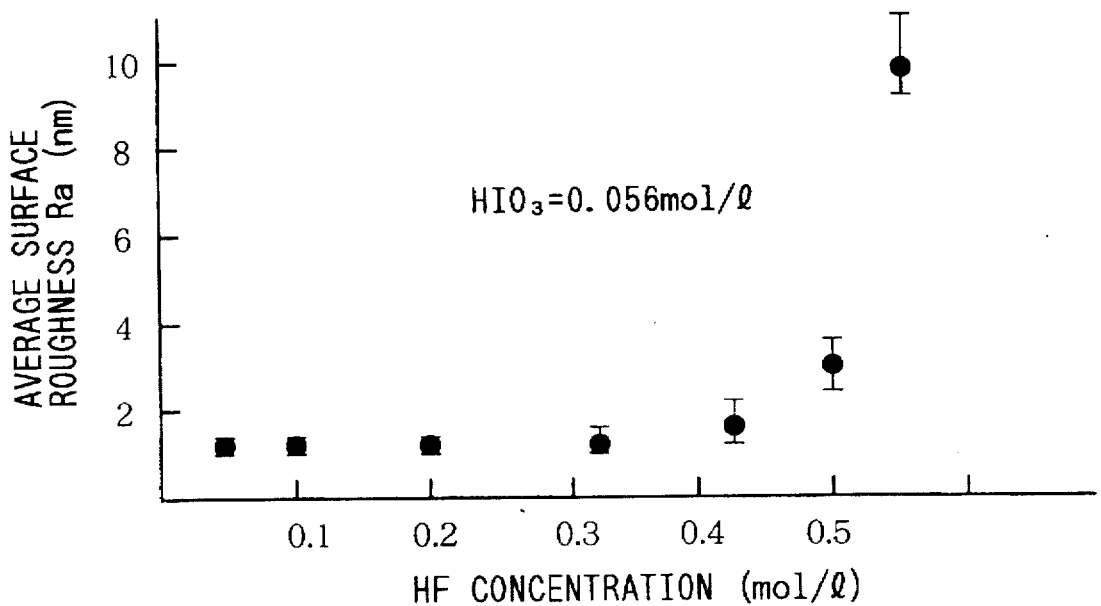

FIGS. 2(a) and 2(b) show the average surface roughness Ra as functions of HF and $HIO_3$ concentrations when Al was etched to a depth of 200 nm. FIG. 2(a) reveals that the average surface roughness decreases with increases in the $HIO_3$ concentration to become substantially equal to the average surface roughness (0.8 to 1.5 nm) of a substrate at 0.04 mol/l. FIG. 2(b) reveals that the average surface roughness of Al is substantially equal to the average surface roughness of the substrate up to a HF concentration of 0.33 mol/l, and then increases to 10 nm or more at a HF concentration of over 0.5 mol/l.

Figure 3:
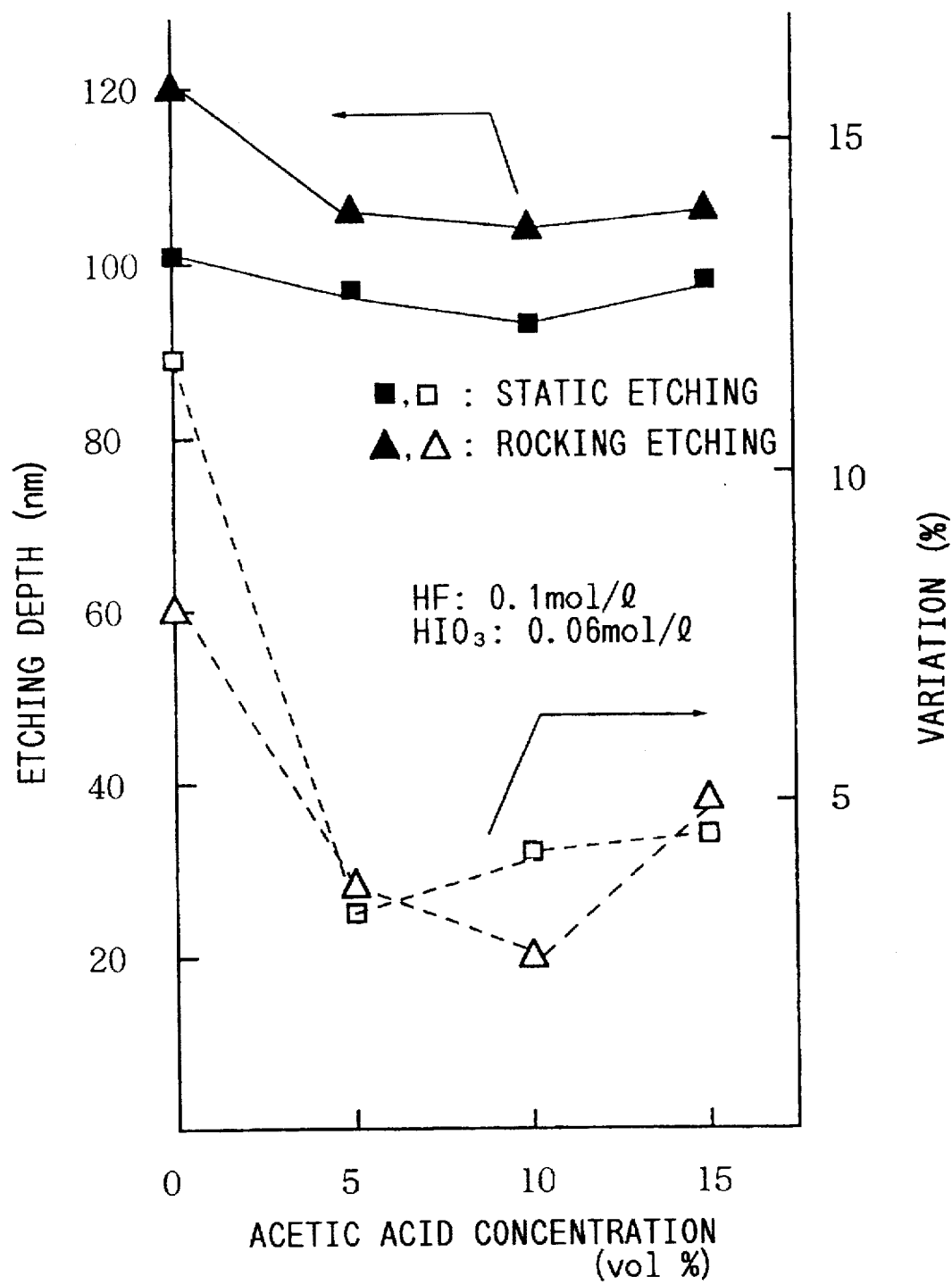
FIG. 3 is a graph showing the relations between the acetic acid concentration and the etching depth and variations in etching depth in a substrate.
Figure 18:
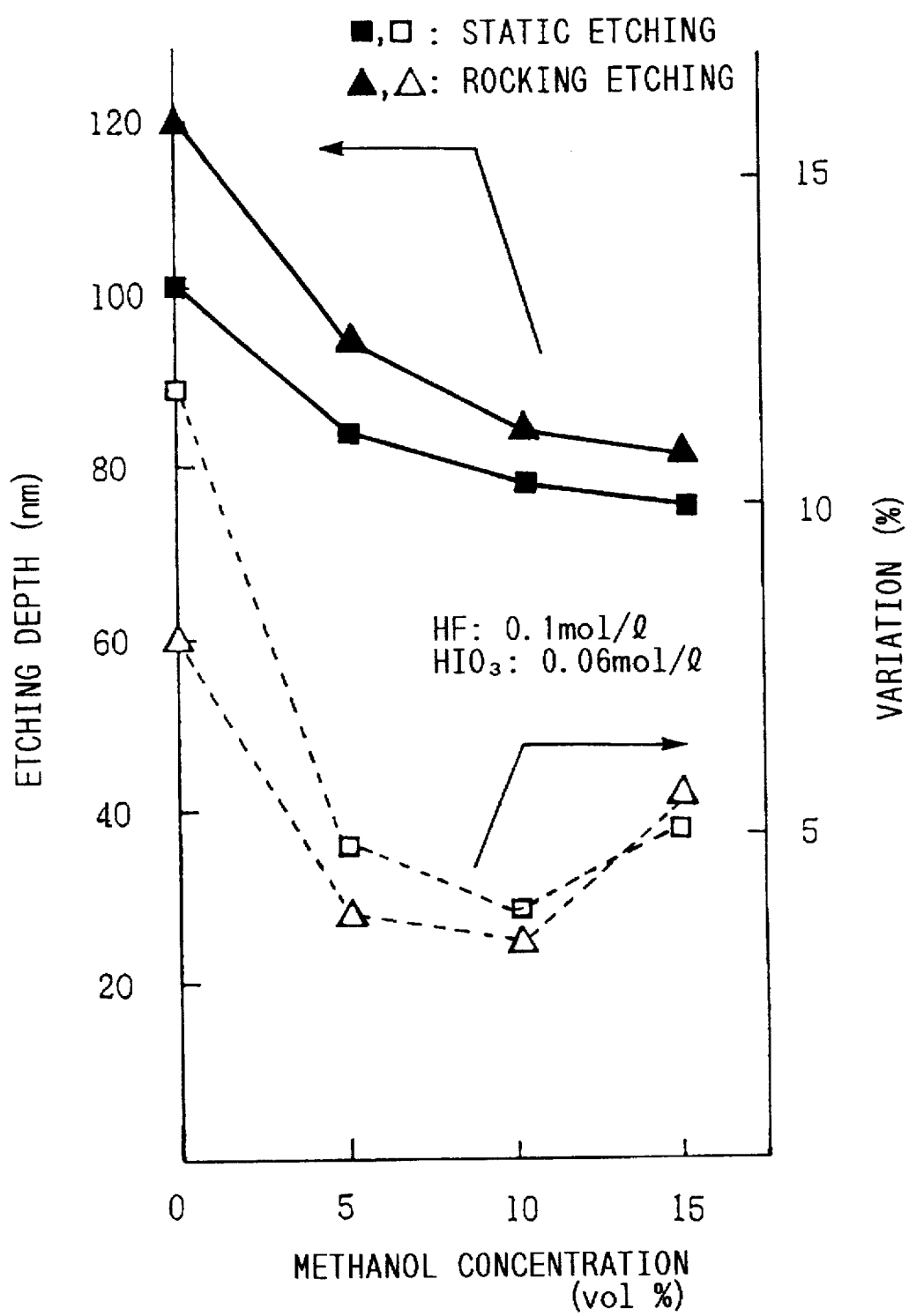
FIG. 18 is a graph showing the relations between the methanol concentration and the etching depth and variations in etching depth within a substrate.
Figure 19:
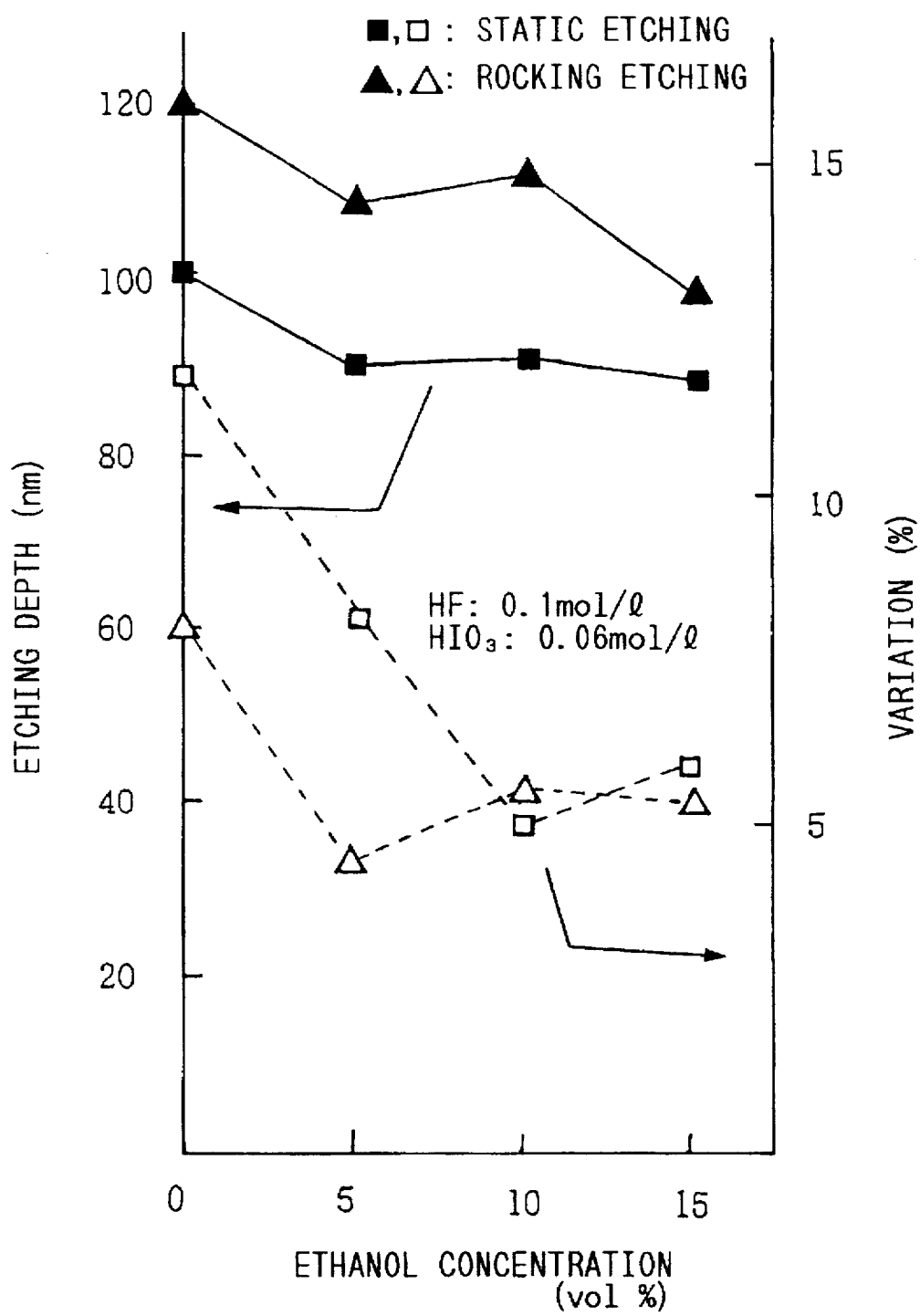
FIG. 19 is a graph showing the relations between the ethanol concentration and the etching depth and variations in etching depth within a substrate.

FIG. 3 is a graph showing the changes in variations of the etching depth within a glass substrate, having Al deposited thereon by sputtering, which were caused by the addition of acetic acid. In FIG. 3, each data point along a solid line represents the average etching depth based on measurements at five points within the substrate, and each data point along a broken line represents the variation thereof in each of static etching and rocking etching. The variation is obtained by dividing a greater difference between the average and the maximum or minimum of the etching depth by the average. As shown in FIG. 3, the addition of acetic acid inhibits distribution of the etching depth within the substrate. FIG. 18 and 19 show the result of measurements taken when methanol and ethanol were respectively added in place of acetic acid. Similar to the use of acedic acid, the addition of methanol or ethanol inhibits distribution of the etching depth within the substrate.

Table 1 shows the results of visual observation of the Al surface state during etching and after etching. This table shows that the addition of ethanol can inhibit precipitation of a black substance, i.e., iodine.

TABLE 1

| Solution Composition | | | |
|---|---|---|---|
| HF (mol/l) | HIO$_3$ (mol/l) | Ethanol (vol %) | Surface State |
| 0.1 | 0.06 | 0 | Slight precipitation of black substance on the surface. |
| 0.1 | 0.06 | 10 | No precipitation. |
| 0.1 | 0.06 | 20 | No precipitation. |
| 0.1 | 0.06 | 30 | No precipitation. |
| 0.1 | 0.12 | 0 | Precipitation of black substance on the surface. |
| 0.1 | 0.12 | 10 | Slight precipitation of black substance on the surface. |
| 0.1 | 0.12 | 20 | No precipitation. |
| 0.1 | 0.12 | 30 | No precipitation. |

An a-Si layer of 100 nm and an n$^+$-type a-Si layer of 20 nm were then deposited by the plasma CVD method on the glass substrate (100 mm×100 mm) having a SiN$_x$ film formed thereon, and Al was subsequently deposited to 300 nm by sputtering.

After a resist (produced by Tokyo Oka Co., OFPR800Y-4) pattern was used to form twelve concave and twelve convex patterns measuring 2 to 20-μm square, the substrate was immersed in etching solutions having various compositions for examining changes in the etching state with time. The results showed no etching defect, such as separation of the resist from the substrate, in both the concave and convex patterns.

Figures 4A, 4B, 4C:
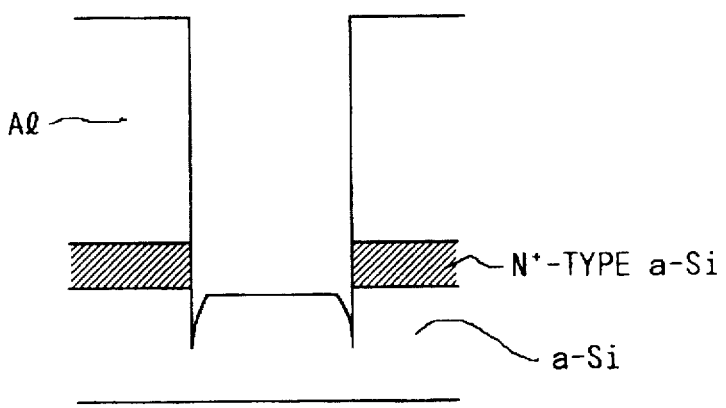
FIGS. 4(a), 4(b) and 4(c) are schematic sectional views showing the etching state of a multi-layer structure comprising a metal and a semiconductor.

FIGS. 4(a), 4(b) and 4(c) are representative views showing sections of the concave patterns, as observed using a scanning electron microscope (SEM). It was found that, by using etching agents within the composition range of the present invention, etching proceeds in all patterns, as shown in FIGS. 4(a) and 4(b), and the depth of etching can be controlled by the immersion time. It was also found that for example, in patterns of 5 μm square, variations in the shapes of the patterns formed are within ±0.1 μm—this indicates that extremely uniform etching can be performed using the etching agents according to the present invention.

It was further found that if the HIO$_3$ concentration is 0.008 mol/l (lower than 0.01 mol/l), abnormal etching occurs in the peripheral portion of the a-Si layer, as shown in FIG. 4(c), and only a small on-current can be obtained for an electronic device.

(Embodiment 2)

A thin film transistor substrate for driving a liquid crystal display having 720×480 pixels was formed using the electronic device manufacturing method of the present invention, as shown in FIGS. 5(a) through 5(e).

Figure 5A:
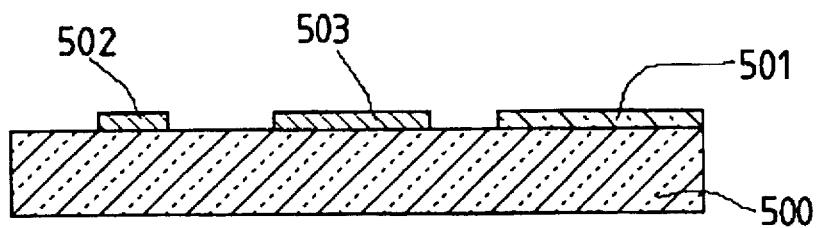
FIGS. 5(a) through 5(e) are a schematic sectional views showing the process of manufacturing a thin film transistor substrate for a liquid crystal display according to a second embodiment of the present invention.

Referring to FIG. 5(a), after a glass substrate 500 (Corning 7059) measuring 100×100 mm was precisely cleaned, a pattern of a transparent electrode 501 (ITO) as formed. A Cr film was then formed to 100 nm by sputtering, and patterned using an etching solution ((NH$_4$)$_2$[Ce(NO$_3$)$_6$]: NHO$_3$: H$_2$O=500 g: 1900 cc: 1870 cc) to form gate electrodes 503 and gate wiring 502.

Figure 5B:
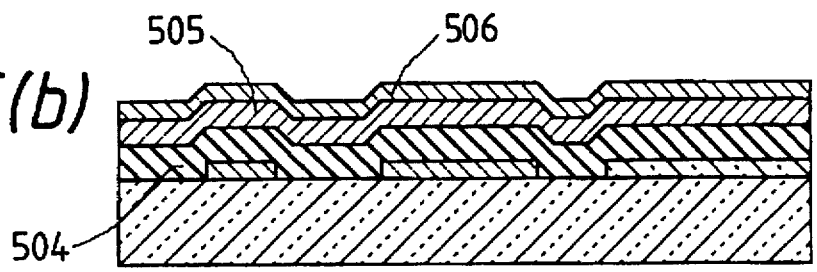

Referring to FIG. 5(b), SiN$_x$ 504, i-type a-Si 505 and n$^+$-type a-Si 506 were then deposited to a thicknesses of 300 nm, 100 nm and 20 nm, respectively, by plasma CVD.

Figure 5C:
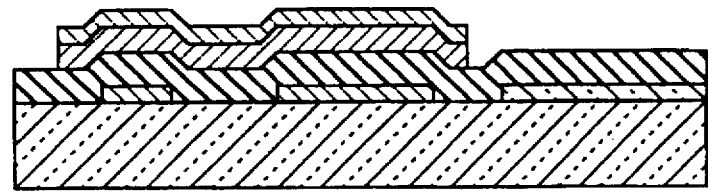

Referring to FIG. 5(c), the n$^+$-type a-Si layer and i-type a-Si layer were then separated into respective pixels using an etching solution (HF: 0.54 mol/l, HIO3: 0.04 mol/l, NH$_4$I: 0.005 mol/l).

Figure 5D:
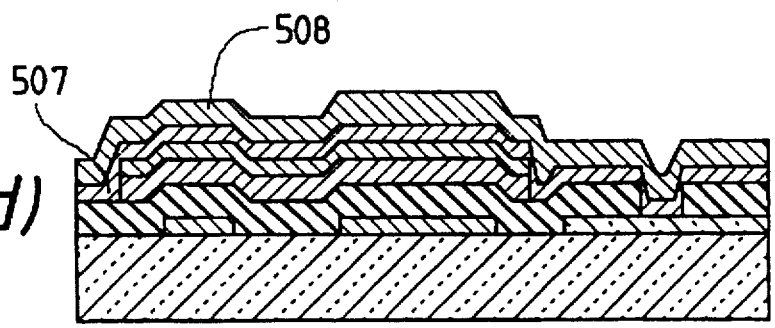

Referring to FIG. 5(d), after contact holes for the pixel electrodes and the gate wiring were formed, a W layer 507 and an Al layer 508 were deposited to 50 nm and 250 nm, respectively, by sputtering.

Figure 5E:
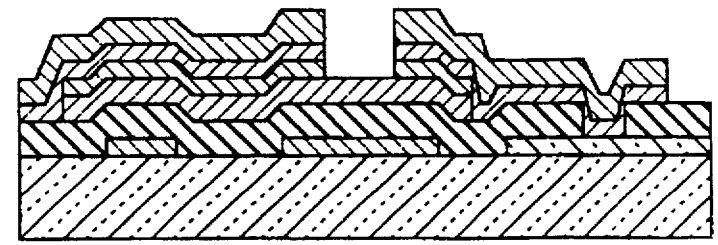

Referring to FIG. 5(e), in order to form source-drain electrodes and wiring and channel portions, the substrate was then immersed in an etching solution containing 0.1 mol/l of HF and 0.04 mol/l of HIO$_3$ for 7 minutes to continuously etch the Al layer 508, the W layer 507 and the n$^+$-type a-Si.

In the final stage, a passivation layer comprising SiN$_x$ was deposited to 400 nm by the plasma CVD method, contact holes were formed on the gate wiring, and the source-drain wiring was formed to complete the thin film transistor.

Figure 6:
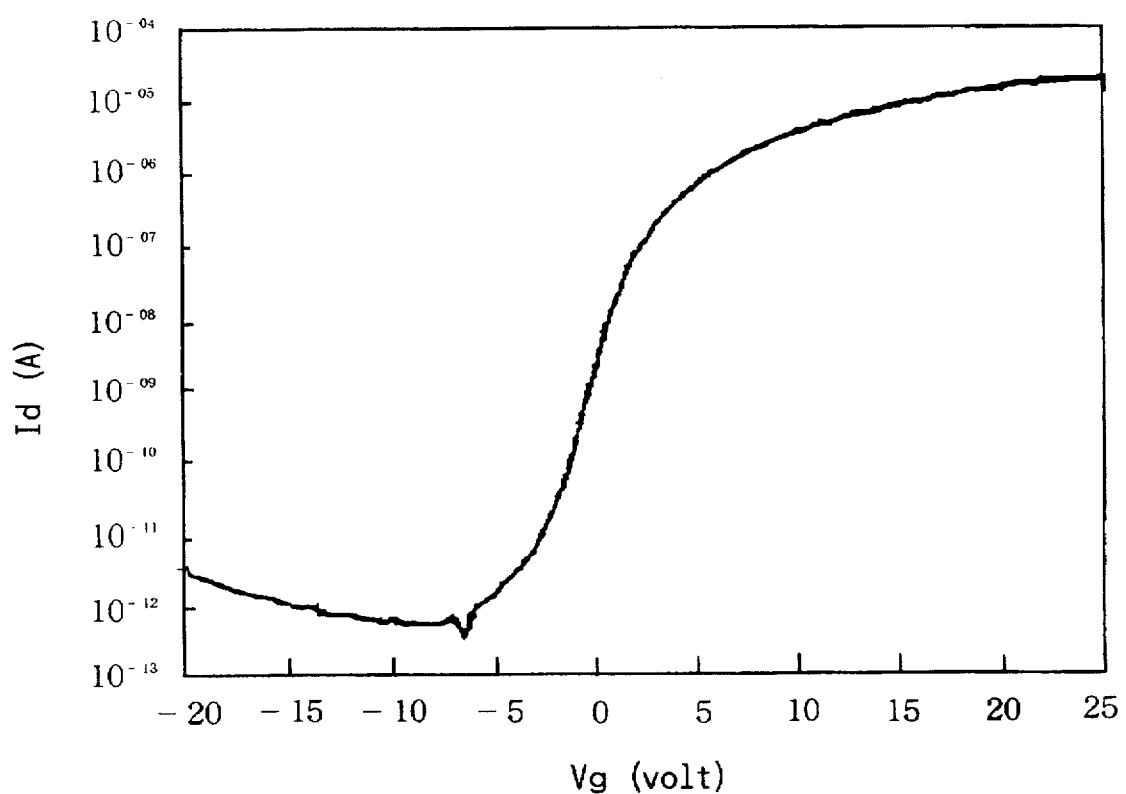
FIG. 6 is a graph showing the Id-Vg characteristics of a thin film transistor.

Measurements of the Id-Vg characteristics of the thus-formed thin film transistor are shown in FIG. 6. As is obvious from FIG. 6, good results were obtained, i.e., the on-current I$_{ON}$ was 1.8 to 30 μA, and the off-current I$_{OFF}$ was several pA.

Although the above embodiments relate to etching for forming the channel portions, and the source-drain electrodes, for separating respective pixels and so on in the thin film transistor, etching can of course be used for other stages, for example, for forming the gate electrodes and wiring. Needless to say, the present invention can also be applied to a MOS polysilicon gate, CCD, an image scanner and various multi-layer structures, each comprising a conductor layer and a semiconductor layer in various electronic devices other than the thin film transistor.

(Embodiment 3)

An array of 100×100 TFTs were formed using the electronic device manufacturing method of the present invention in accordance with the procedure shown in FIGS. 7(a) through 7(e).

Figure 7A:
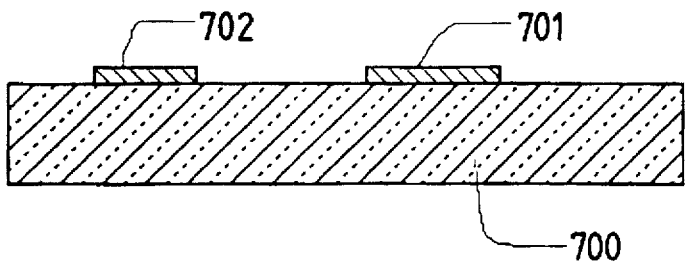
FIGS. 7(a) through 7(e) are schematic sectional views showing the process of manufacturing a TFT substrate according to a third embodiment of the present invention.

Referring to FIG. 7(a), after a glass substrate 700 (Corning 7059) measuring 100×100 mm was precisely cleaned, a Cr film 100 nm thick was formed by sputtering, and then patterned using an etching solution (ammonium cerium (IV) nitrate: 71% HNO$_3$: H$_2$O=500 g : 1900 cc: 1870 cc) to form gate electrodes 701, having a width of 7 μm, and gate wiring 702, having a width of 5 μm.

Figure 7B:
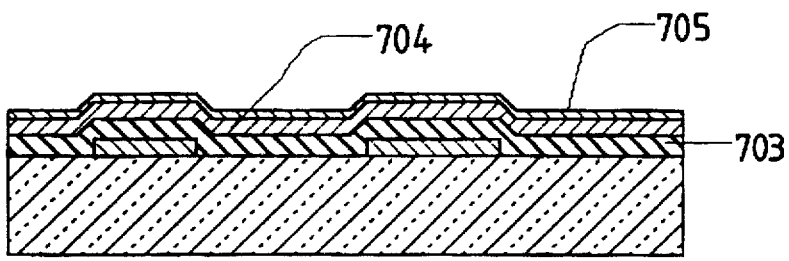

Referring to FIG. 7(b), a SiN$_x$ layer 703, an i-type a-Si layer 704 and an n$^+$-type a-Si layer 705 were then deposited to 300 nm, 100 nm and 20 nm, respectively, by plasma CVD. The film formation conditions for each of the films are shown in Table 2.

TABLE 2

| | SiN$_2$ | i-type a-Si | n$^+$-type a-Si |
|---|---|---|---|
| Gas flowrate (sccm) | | | |
| SiH$_4$ | 30 | 200 | 200 |
| H$_2$ | 1000 | 800 | 800 |
| NH$_3$ | 60 | — | — |
| PH$_3$ | — | — | 2 |
| Pressure (Torr) | 0.8 | 0.8 | 0.8 |
| RF power (W) | 400 | 100 | 100 |
| Film formation temperature (°C.) | 300 | 250 | 250 |

Figure 7C:
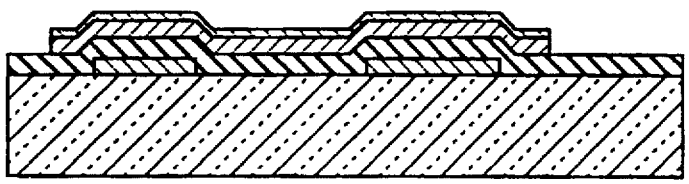

Referring to FIG. 7(c), an n$^+$-type a-Si layer and an i-type a-Si layer were separated to form respective TFT devices using an etching solution (HF: 0.54 mol/l, HIO$_3$: 0.04 mol/l).

Figure 7D:
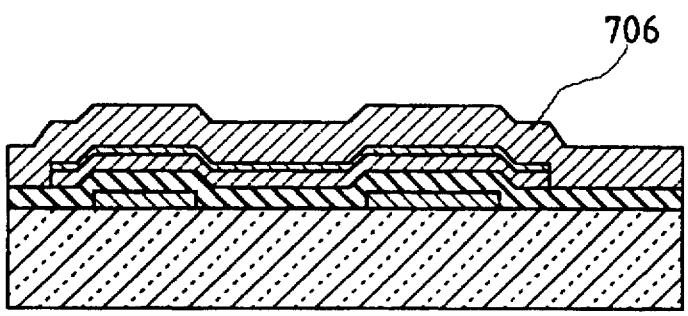

Referring to FIG. 7(d), after contact holes for the gate wiring were formed, an Al layer 706 (containing 1% Si) was deposited to a thickness of 250 nm by sputtering.

Figure 7E:
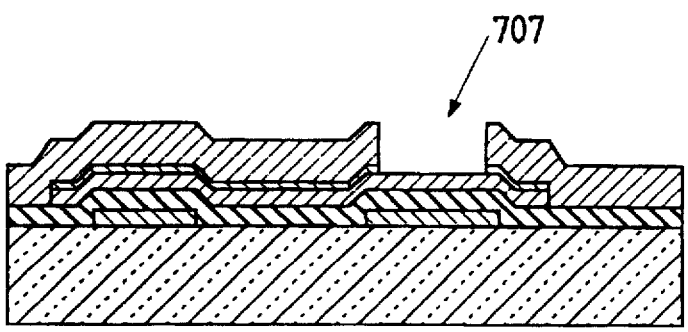

Referring to FIG. 7(e), in order to form source-drain electrodes and wiring and channel portions 707 (channel length 4 μm, channel width 6 μm), the Al layer and the n⁺-type a-Si layer were simultaneously etched by immersing the substrate in an etching solution (25° C.) containing 0.1 mol/l of HF and 0.04 mol/l of HIO₃ for 3 minutes.

Figure 8:
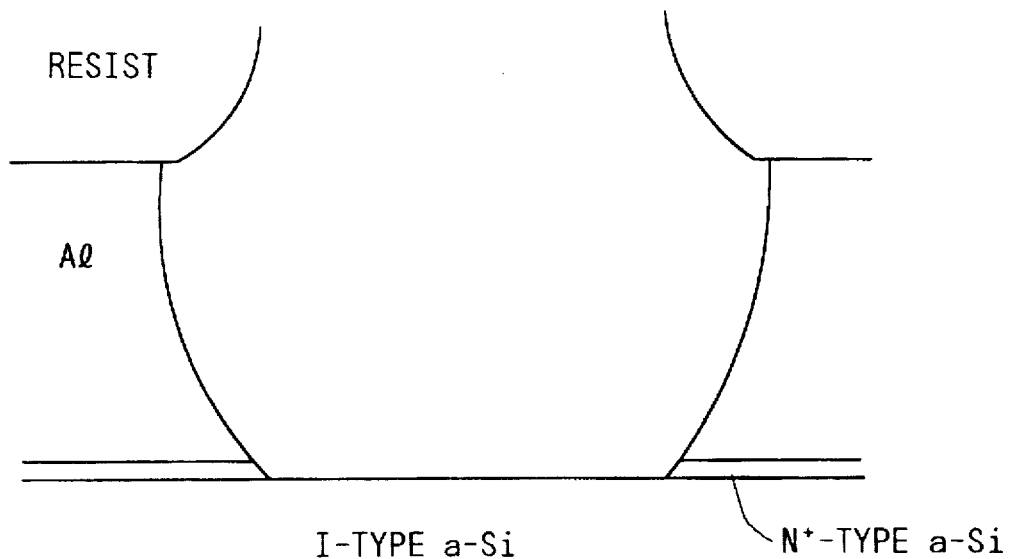
FIG. 8 is a sketch showing a sectional SEM image of a channel portion.

FIG. 8 is a sketch showing an enlarged sectional SEM image of a channel portion after etching. It is found from FIG. 8 that a smooth opening is formed without a gap between the Al layer and the n⁺-type a-Si layer.

After the resist was removed, a passivation layer comprising SiN$_x$ was deposited to a thickness of 400 nm, and contact holes were formed on the gate wiring and source-drain wiring to complete the thin film transistors.

The carrier mobility, threshold values, ON currents and OFF currents of the thus-manufactured 10⁴ TFTs were measured, and variations thereof were evaluated. A reliability test was also carried out, and characteristics of the device following the test were compared with the initial values. The results obtained are shown in Table 3. In the reliability test, the TFT substrate was placed in an environmental tester at a temperature of 85° C. and a relative humidity of 85% and allowed to stand for 1000 hours.

(COMPARATIVE EXAMPLE 1)

Figure 17A:
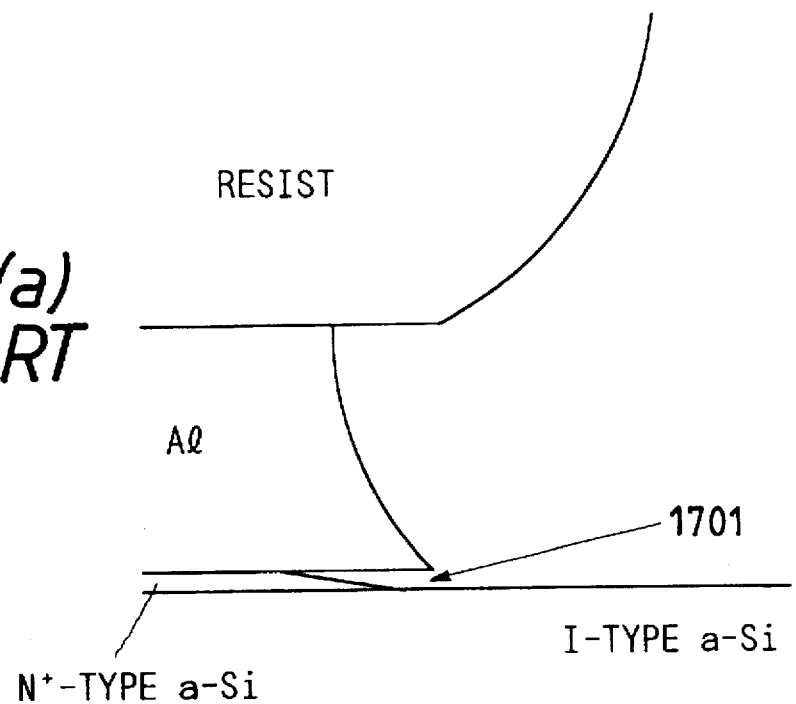
FIGS. 17(a) and 17(b) are sketches showing a sectional SEM image of a channel portion of a conventional TFT.

For comparison, thin film transistors were manufactured by the same method as Embodiment 3 with the exception that Al and n⁺-type a-Si were respectively etched using the etching solutions described below. In a channel portion, a gap was observed between the Al layer and n⁺-type a-Si layer, as shown in FIG. 17(a).

Etching solution for Al;

85% phosphoric acid: 71% nitric acid:

glacial acetic acid: water =16:1:2:1 (40° C.)
Etching solution for n⁺-type a-Si;

49% hydrofluoric acid: 71% nitric acid:

glacial acetic acid =1:60:120 (15.2° C.)

The thus-obtained sample was evaluated by the same method as Embodiment 3. The results obtained are shown in Table 3.

TABLE 3

|  | Embodiment 3 | | Comparative Example 1 | |
|---|---|---|---|---|
|  | Initial | After test | Initial | After test |
| Carrier mobility (cm2/v sec) | 0.8 ± 0.1 | 0.78 ± 0.15 | 0.7 ± 0.15 | 0.4 ± 0.2 |
| Threshold (V) | 1.0 | 1.0 | 1.5 | 2.5 |
| ON current (A) | 2 × 10⁻¹⁶ | 2 × 10⁻⁶ | 1.5 × 10⁻⁶ | 2 × 10⁻⁶ |
| OFF current (A) | 1 × 10⁻¹³ | 1 × 10⁻¹² | 1 × 10⁻¹² | 1 × 10⁻⁹ |

As shown in Table 3, the TFTs of this embodiment have excellent carrier mobility and TFT characteristics and exhibit less variation than the comparative example 1. Therefore devices produced using the method according to the present invention exhibited superior characteristics, as compared with devices produced using the conventional method. It was also found that the devices produced according to the present invention show substantially no deterioration in characteristics under severe environmental conditions and have high reliability.

(Embodiment 4)

A thin film transistor substrate for driving a liquid crystal display having 710×480 pixels was manufactured using the electronic device manufacturing method of the present invention, as shown in FIGS. 9(a) through 9(e).

Figure 9A:
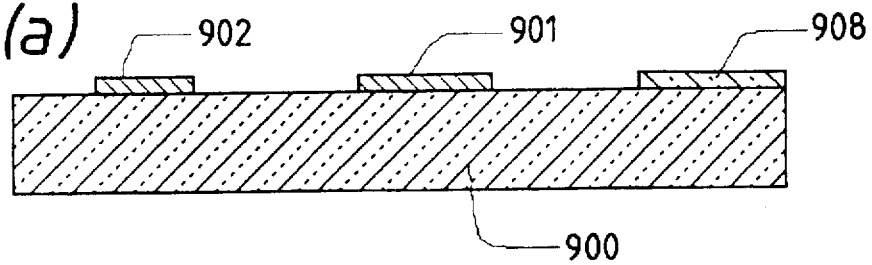
FIGS. 9(a) through 9(e) are schematic sectional views showing the process of manufacturing a liquid crystal display TFT substrate according to a fourth embodiment of the present invention.

Referring to FIG. 9(a), after a glass substrate 900 (Corning 7059) measuring 100×100 mm was precisely cleaned, a pattern of a transparent electrode 908 (ITO) was formed. Gate electrodes 901, having a width of 7 μm, and gate wiring 902 were subsequently formed by the same method as described in Embodiment 3 (above).

Figure 9B:
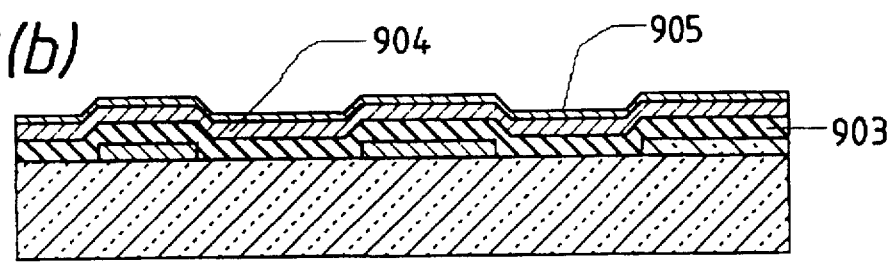

Referring to FIG. 9(b), a SiN$_x$ layer 903, an i-type a-Si layer 904 and an n⁺-type a-Si layer 905 were then deposited to thicknesses of 300 nm, 100 nm and 20 nm, respectively, by the plasma CVD process under the conditions shown in Table 2.

Figure 9C:
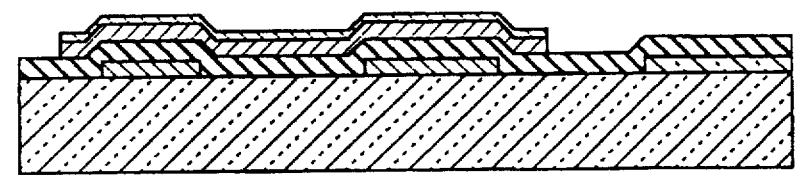

Referring to FIG. 9(c), the n⁺-type a-Si layer 905 and the i-type a-Si layer 904 were then separated to form respective pixels using an etching solution (HF: 0.54 mol/l, HIO₃: 0.04 mol/l).

Figure 9D:
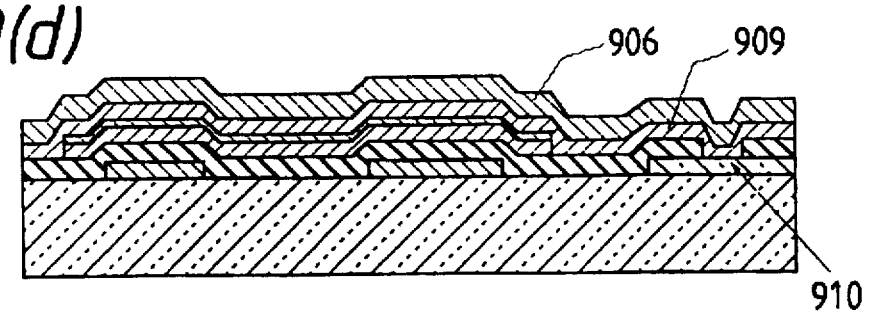

Referring to FIG. 9(d), after contact holes for the pixel electrodes and gate wiring were formed, a W layer 909 and an Al layer 906 were deposited to 50 nm and 250 nm, respectively, by sputtering.

Figure 9E:
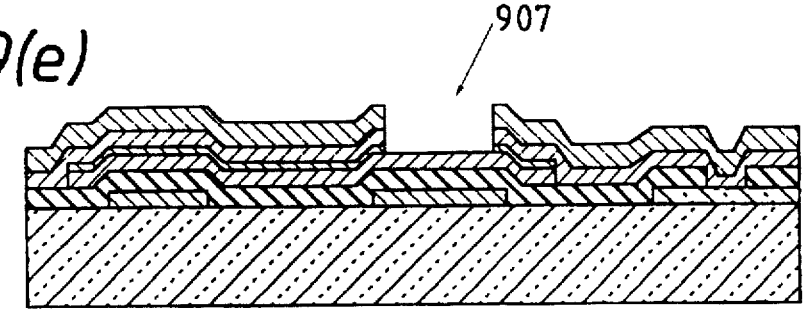

Referring to FIG. 9(e), in order to form source-drain electrodes and wiring and channel portions (channel length 4 μm, channel width 6 μm), the Al, W and n⁺-type a-Si layers were continuously etched by immersing the substrate in an etching solution containing 0.1 mol/l of HF and 0.04 mol/l of HIO₃ for 7 minutes.

Figure 10:
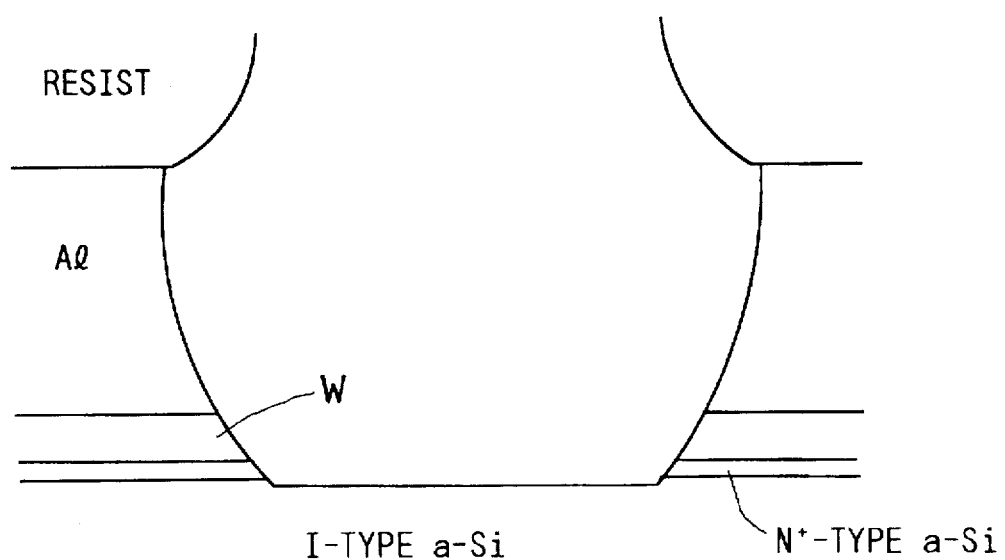
FIG. 10 is a sketch showing a sectional SEM image of a section of a channel portion.
Figure 17B:
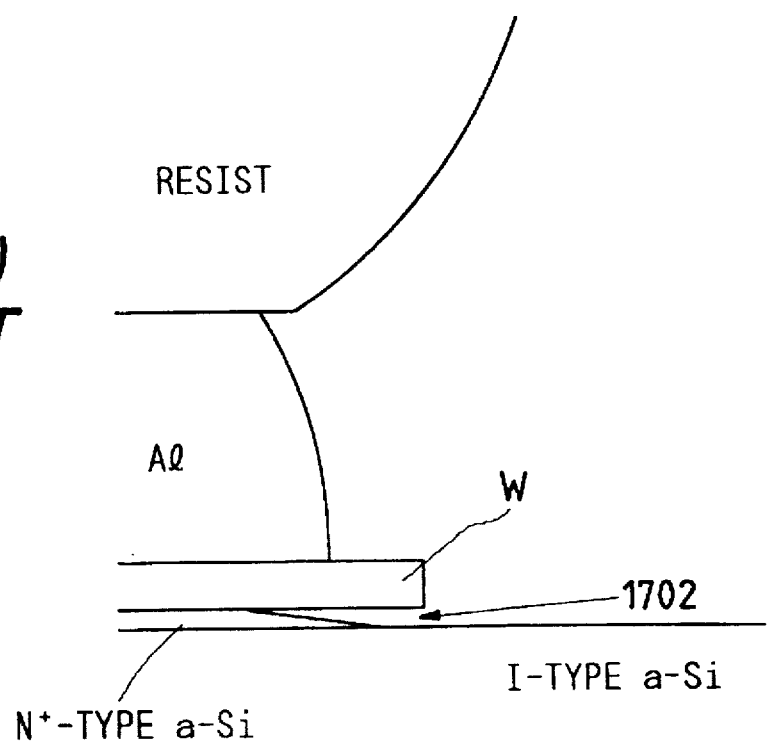

FIG. 10 is a sketch showing an enlarged sectional SEM image of the channel portion 907 after etching the n⁺-type a-Si. Referring briefly to FIG. 17(b), it is recalled that in the conventional process, a gap 1702 was formed between the W layer and n⁺-type a-Si layer. Referring back to FIG. 10, it is shown that, in accordance with the present invention, a gap is not formed between the Al layer and the W layer, and an smooth opening was obtained.

In the final stage, a passivation layer comprising SiN$_x$ was deposited to a thickness of 400 nm by plasma CVD, and contact holes were formed on the gate wiring and source-drain wiring to complete a thin film transistor substrate.

Evaluation of the thin film transistors of Embodiment 4, using the same methods as in Embodiment 3, showed that the thin film transistors exhibited excellent characteristics without variations, as in Embodiment 3. The reliability was also excellent as in Embodiment 3.

A liquid crystal display was assembled using a TFT substrate, which was manufactured separately, and an image was evaluated by inputting video signals to the display. The image was found to have excellent contrast and was displayed stably.

(Embodiment 5)

In this embodiment, the TFT substrate shown in FIGS. 11 through 15 was manufactured.

Figure 15A:
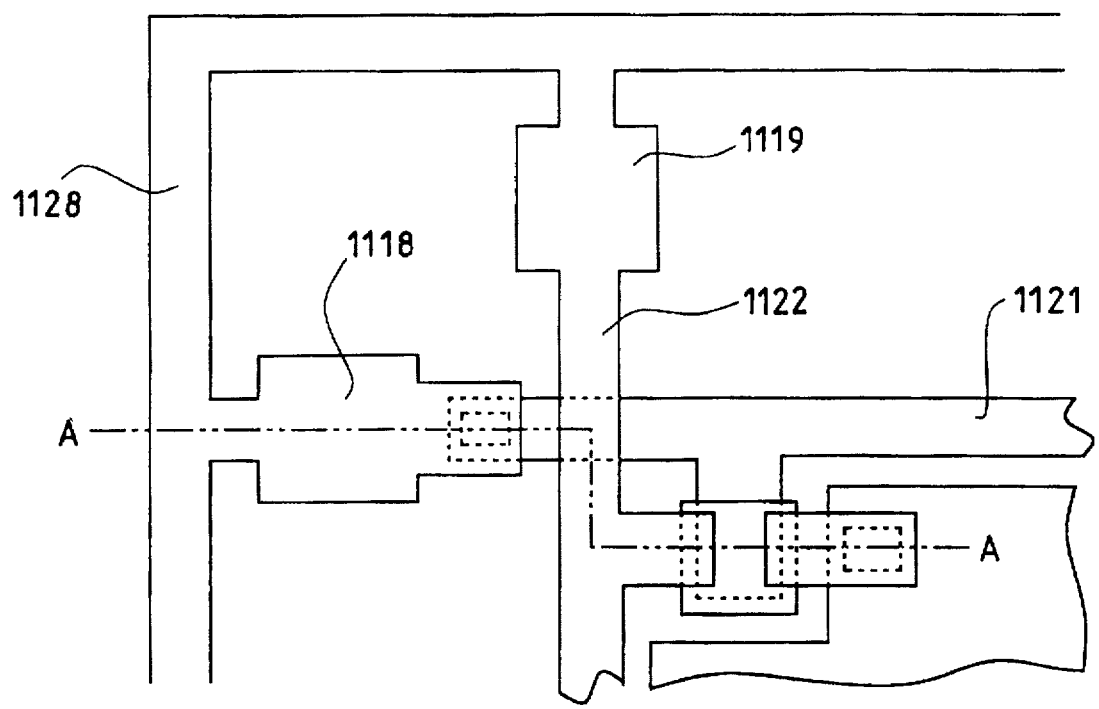
FIGS. 15(a) and 15(b) are plan and sectional views, respectively, showing the process of manufacturing the TFT substrate according to the fifth embodiment.
Figure 15B:
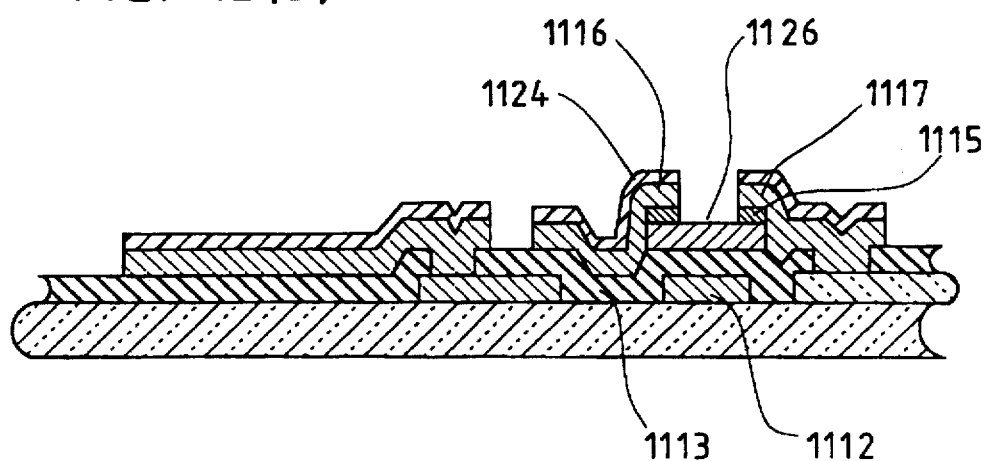

In order to prevent breakage of transistors due to static electricity generated in the manufacturing process, a guard ring 1128 connecting source terminals 1119 and gate terminals 1118 is provided, as shown in FIGS. 15(a) and 15(b). The guard ring 1128 is removed in the final stage.

The structure of a TFT substrate will now be described.

FIGS. 11(a) through 11(d) illustrate the TFT substrate of this embodiment, wherein FIG. 11(a) is a plan view and FIGS. 11(b), 11(c) and 11(d) are sectional views taken long lines A—A, B—B and C—C, respectively, in FIG. 11(a).

The TFT has a reverse stagger structure including a Cr gate electrode 1112 having a width of 10 μm and a thickness of 100 nm, and Cr gate wiring 1121 for supplying scanning signals to the gate electrode 1112, both of which are formed on a glass substrate 1111 (Corning Co. 7059). A gate insulating film 1113 comprising a silicon nitride thin film having a thickness of 200 nm was formed on the gate electrode 1112 and gate wiring 1121. A semiconductor active film 1114 having a thickness of 50 nm and comprising i-type a-Si was formed on the gate insulating film 1113, and an Al source electrode 1116 and drain electrode 1117 having a thickness of 100 nm and a width of 10 µm were further formed on the semiconductor layer 1114. An $n^+$-type a-Si ohmic contact layer 1115 having a thickness of 20 nm and containing phosphorus is formed between the semiconductor active layer 1114 and the source and drain electrodes 1116 and 1117.

Figure 12:
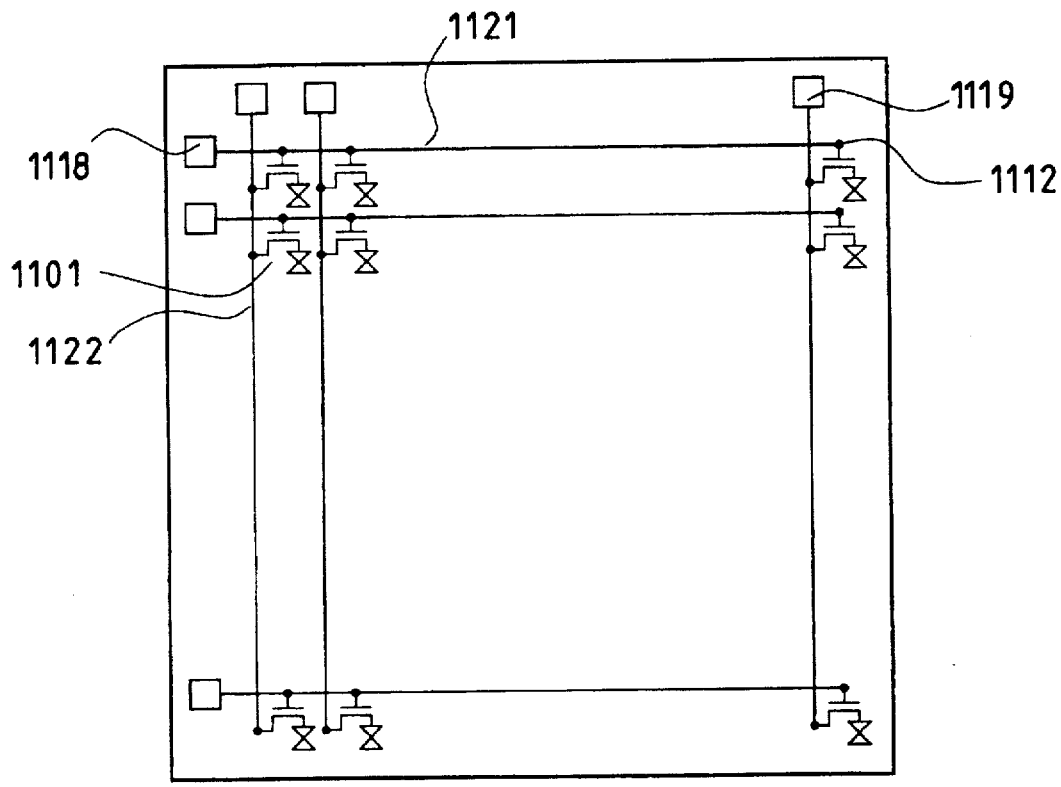
FIG. 12 is a schematic plan view showing the TFT substrate according to the fifth embodiment.
Figure 16:
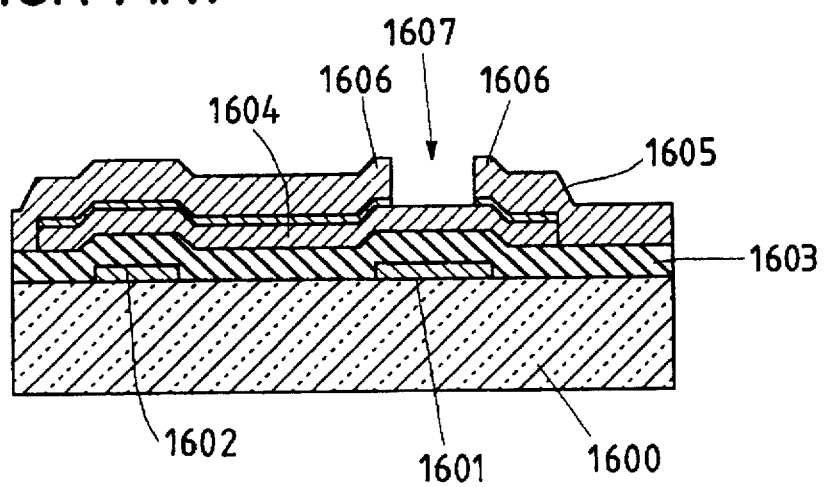
FIG. 16 is a sectional view showing a conventional TFT.

Many thus-formed TFTs are formed in a matrix at a pitch of 100 µm on the substrate, as shown in FIG. 12. On the peripheral portions of the substrate 1111 are formed source terminals 1119 for supplying image signals, provided from an external image circuit, to the source electrodes 1116 through the source wirings 1122, and gate terminals 1118 for supplying scanning signals, provided from an external scanning circuit, to the gate electrodes 1112 through the gate wirings 1121. The source terminals 1119 are formed using Al, which is the same conductor material used for the source electrodes 1116 and the source wiring 1122. The gate terminals 1118 also Al, and are respectively formed on the gate insulating films 1113 through the contact holes 1123 formed in the gate insulating films 1113 on the gate wirings 1121.

Referring back to FIGS. 11(b) through 11(d), a protective film 1127, comprising a silicon nitride film and having a thickness of 300 nm, is formed on the TFTs 1101, gate wirings 1121, source wiring 1122, source terminals 1119 and gate terminals 1118. However, the surfaces of the source terminals 1119 and gate terminals 1118 are partially exposed so that they can be electrically connected to the image circuit and the scanning circuit. Both widths S1 and G1 of the conductors which respectively form the source terminals 1119 and gate terminals 1118 are 50 µm, and both effective connection widths S0 and G0 of the source terminals 1119 and gate terminals 1118, from which the protective film 1127 is removed, are 42 µm. Namely, the processing precision is 4 µm.

The method of manufacturing the TFT substrate of this embodiment is described below.

Figure 13A:
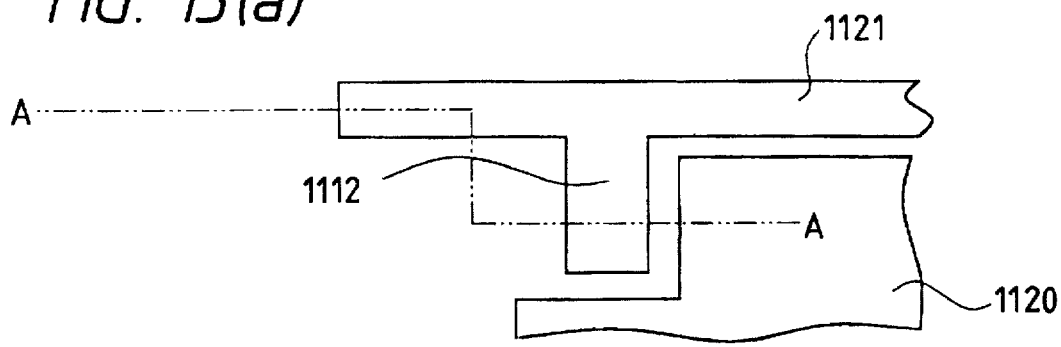
FIGS. 13(a) and 13(b) are plan and sectional views, respectively, showing the process of manufacturing the TFT substrate according to the fifth embodiment.
Figure 13B:
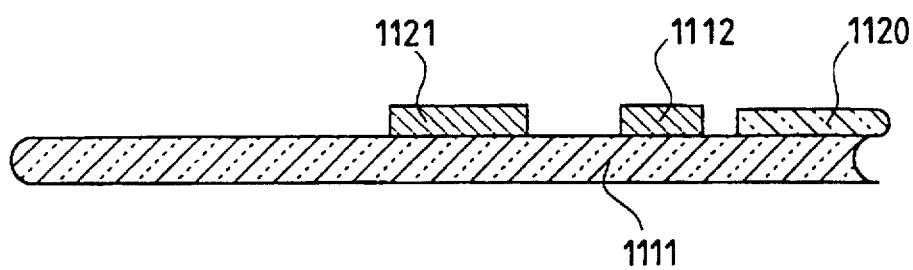

A Cr thin film having a thickness of 100 nm was formed by sputtering on the surface of a glass substrate 1111, upon which a pixel electrode 1120 comprising a transparent conductive film was formed. A resist was formed on the surface of the glass substrate and then subjected to mask exposure, development, etching and separation treatment to form gate electrodes 1112 and gate wiring 1121 in a desired shape. This is shown in FIGS. 13(a) and 13(b). FIG. 13(a) is a schematic plan view, FIG. 13(b) is a sectional view taken along line A—A of FIG. 13(a).

A gate insulating film 1113 having a thickness of 200 nm and comprising a $SiN_x$ thin film, an i-type a-Si film 1114 having a thickness of 50 nm, and an $n^+$-type a-Si ohmic contact layer 1115 having a thickness of 20 nm and containing phosphorus were then formed, by the plasma CVD process, on the surface of the substrate 1111 on which the gate electrodes 1112 and gate wiring 1121 were formed.

Figure 14A:
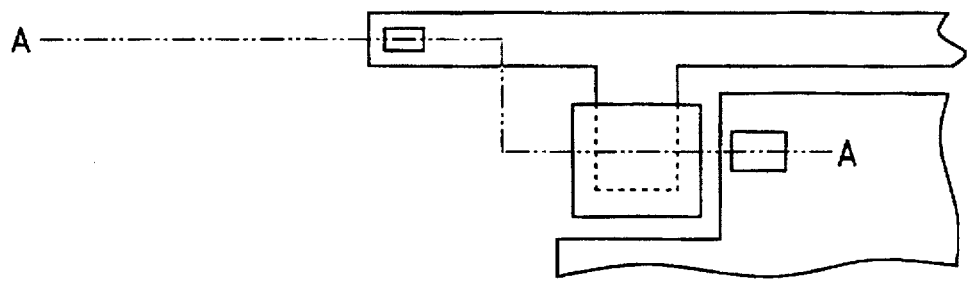
FIGS. 14(a) and 14(b) are plan and sectional views, respectively, showing the process of manufacturing the TFT substrate of according to the fifth embodiment.
Figure 14B:
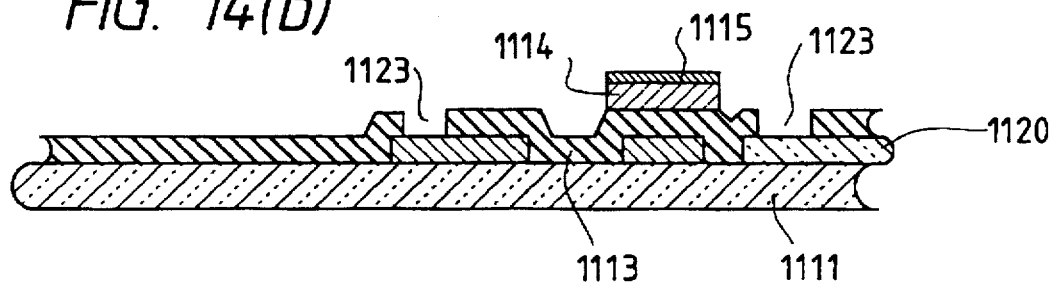

The semiconductor active layer 1114 and the ohmic contact layer 1115 were subjected to a photo phosphorus process to form semiconductor islands having a predetermined shape. Contact holes 1123 were formed in the gate insulating film 1113 on the pixel electrode 1120 and gate wiring 1121. This state is shown in FIG., 14. FIG. 14(a) is a schematic plan view, and FIG. 14(b) is a sectional view taken along line A—A in FIG. 14(a).

An Al thin film having a thickness of 100 nm was formed on the substrate including the ohmic contact layer 1115 by the sputtering method using an Al target containing 1% Si. A resist film 1124 was formed on the surface of the Al thin film, exposed and developed, and the Al and ohmic contact layer were then etched by the same method as Embodiment 1 to form the source electrodes 1116, source wiring 1122, source terminals 1119, drain electrodes 1117 and guard ring 1128 for electrically connecting the source terminals 1119 and gate terminals 1118, gate terminals 1118 and channels 1126, as shown in FIGS. 15(a) and 15(b). At this time, the gate terminals 1118 were formed by processing the conductor so as to completely cover the gate wiring 1121 below the contact holes 1123 with Al wiring. FIG. 15(a) is a schematic plan view, and FIG. 15(b) is a sectional view taken along line A—A in FIG. 15(a).

In this embodiment, as shown in FIGS. 15(a) and 15(b), the ohmic contact layer 1115 is electrically connected to the source wiring 1122, source terminals 1119, guard ring 1128, gate 1121 and s 1118, gate wiring 1121 and gate electrodes 1112 through the source electrodes 1118 located immediately above the ohmic contact layer. However, since all surfaces of the gate terminals 1118, gate wiring 1121 and gate electrodes 1112 are covered with the gate insulating film 1113 serving as an insulator or the conductor which forms the source wiring 1122, and all conductors which form the source wiring 1122, source terminals and guard ring 1128 are covered with the resist film 1124 serving as an insulator. Namely, all conductive members electrically connected to the ohmic contact layer 1115 are covered with an insulator. When the ohmic contact layer 1115 is treated with an etching solution containing an electrolyte, therefore, the ohmic contact layer 1115 does not form a battery with another conductor, and is not abnormally etched due to the battery effect. In etching of the ohmic contact layer 1115, it is possible to prevent side etching due to the battery effect by covering the layers electrically connected to the ohmic contact layer.

Referring again to FIGS. 11(b) through 11(d), a protective film 1127 comprising a silicon nitride thin film was then formed, and a resist film was formed on the surface thereof and then subjected to mask exposure, development, etching and separation treatment to expose the source terminals 1119 and gate terminals 1118. Since the gate terminals 1118 and source terminals 1119 were formed on the gate insulating film 1113, the gate terminals could be formed only by removing the protective film 1127. The guard ring 1128 for connecting the gate wiring 1121 and source wiring 1122 was then removed to form the TFT substrate shown in FIG. 11(a).

The thus-formed TFT substrate 1111 includes a plurality of TFTs arranged in a matrix with a pitch of 100 µm. Along a periphery of the substrate 1111 are arranged the source terminals for receiving the video signals transmitted from an external video circuit to the source electrodes 1116 through the source wiring 1122, and the gate terminals 1118 for receiving scanning signals supplied from an external scanning circuit to the gate electrodes 1112 through the gate wiring 1121.

The etching agent of the present invention enables fine patterning of a multi-layer structure comprising a conductor and a semiconductor with a single etching agent. Since this patterning has high uniformity, it can preferably be applied to manufacture of electronic devices having a large area and high density.

The electronic device of the present invention exhibits excellent characteristics, less variations, and high reliability. The present invention can provide many elements such as TFTs which are required to operate at high speeds and have uniform characteristics.

The electronic device manufacturing method of the present invention provides a simple manufacturing process with high yield, as compared with conventional methods. It is thus possible to decrease the production costs of various electronic devices using the above-described methods pertaining to the present invention.

What is claimed is:

1. A method for manufacturing an electronic device having a multi-layer film including a semiconductor layer, an ohmic contact layer formed on the semiconductor layer, and a conductor layer formed on the semiconductor layer, the method comprising the steps of:

forming an opening by simultaneously etching portions of said conductor layer and said ohmic contact layer using an etching solution such that an etching rate of said conductor layer is higher than an etching rate of said ohmic contact layer; and forming a passivation film within said opening;

wherein the etching solution comprises, in a solution, hydrofluoric acid at a concentration of 0.05 to 0.33 mol/l, halooxoacid ions at a concentration of at least 0.01 mol/l, and iodine ions ($I^-$), wherein the halooxoacid is represented by the formula $(XO_n)^{p-}$, where X is a halogen element, n is 3, 4 or 6, and p is 1, 2 or 3.

2. An electronic device manufacturing method according to claim 1, wherein said semiconductor layer consists of amorphous silicon.

3. An electronic device manufacturing method according to claim 1 or 2, wherein said opening forms a channel portion of a reverse stagger type thin film transistor.

4. A method for manufacturing an electronic device comprising: simultaneously etching an ohmic contact layer and a conductor layer, which are laminated on the surface of a semiconductor layer, using an etching solution comprising hydrofluoric acid at a concentration of 0.05 to 0.5 mol/l, halooxoacid ions at a concentration of at least 0.01 mol/l, and iodine ions ($I^-$), wherein the halooxoacid is represented by the formula $(XO_n)^{p-}$, where X is a halogen element, n is 3, 4 or 6, and p is 1, 2 or 3.

5. An electronic device manufacturing method according to claim 4, wherein said halooxoacid ions are iodic acid ions ($IO_3^-$).

6. An electronic device manufacturing method according to claim 4 or 5, wherein said iodine ions are produced by adding $NH_4I$, KI or NaI to the etching solution.

7. An electronic device manufacturing method according to any one of claims 4 or 5, wherein said etching solution contains a water-soluble organic solvent.

8. An electronic device manufacturing method according to claim 7, wherein said water-soluble organic solvent is one of acetic acid, methanol and ethanol, and the concentration thereof is 70% by volume or less.

9. An electronic device manufacturing method according to any one of claims 1 2, 4 or 5, wherein said ohmic contact layer is formed by adding impurities to a semiconductor layer.

10. An electronic device manufacturing method according to claim 9, wherein said impurities are phosphorus or boron.

11. An electronic device manufacturing method according to any one of claims 4 or 5, wherein said conductor layer consists of one of a metal selected from the group consisting of Al, Mo, Ni, Ta, Pt, Ti, Pd, W, Co or Cr, an alloy thereof and a metallic compound thereof.

12. An electronic device manufacturing method according to claim 11, wherein said conductor layer includes a multi-layer structure comprising at least two layers consisting of said one of said metal, said alloy and said metallic compound.

13. An electronic device manufacturing method according to any one of claims 4 or 5, wherein said electronic device is a reverse stagger type thin film transistor comprising a semiconductor layer comprising an amorphous silicon thin film, an ohmic contact layer comprising an amorphous silicon thin film containing phosphorus, and a conductor layer consisting of aluminum, a source electrode, a drain electrode and a channel portion being continuously formed by processing using said etching agent.

14. An etching agent comprising, in a solution:

hydrofluoric acid at a concentration of 0.05 to 0.5 mol/l;

halooxoacid ions at a concentration of 0.01 mol/l or more, wherein the halooxoacid ions are represented by the formula $(XO_n)^{p-}$, where X is a halogen element, n is 3, 4 or 6, and p is 1, 2 or 3; and iodine ions ($I^-$).

15. An etching agent according to claim 14, wherein said halooxoacid ions are iodic acid ions ($IO_3^-$).

16. An etching agent according to claim 1, wherein said iodine ions are produced by adding $NH_4I$, KI, or NaI thereto.

17. An etching agent according to any one of claims 14, 15 or 16, further comprising a water-soluble organic solvent.

18. An etching agent according to claim 17, wherein said water-soluble organic solvent is one of acetic acid, methanol and ethanol, and the concentration thereof is 70% by volume or less.

* * * * *

UNITED STATES PATENT AND TRADEMARK OFFICE
CERTIFICATE OF CORRECTION

PATENT NO.   : 5,714,407
DATED        : February 3, 1998
INVENTOR(S)  : Matagoro Maeno et al.

It is certified that error appears in the above-indentified patent and that said Letters Patent is hereby corrected as shown below:

<u>In the Claims</u>

In claim 1, line 16, replace "$(XO_n)^-$" with --$(XO_n)^{p-}$--.

In claim 9, line 2, insert "," immediately after "1".

In claim 16, line 1, replace "claim 1" with --claim 14--.

Signed and Sealed this

Second Day of February, 1999

Attest:

Attesting Officer

Acting Commissioner of Patents and Trademarks